(12) United States Patent
Ooka

(10) Patent No.: US 8,258,621 B2
(45) Date of Patent: Sep. 4, 2012

(54) SEMICONDUCTOR DEVICE

(75) Inventor: Hideyuki Ooka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/174,936

(22) Filed: Jul. 1, 2011

(65) Prior Publication Data

US 2011/0260218 A1 Oct. 27, 2011

Related U.S. Application Data

(63) Continuation of application No. 12/615,432, filed on Nov. 10, 2009, now Pat. No. 7,999,385.

(30) Foreign Application Priority Data

Nov. 14, 2008 (JP) .................................. 2008-292034

(51) Int. Cl.
*H01L 23/34* (2006.01)
(52) U.S. Cl. ....................................... 257/724; 257/723
(58) Field of Classification Search .................. 257/723, 257/724, 685, 676, 777, 758, 225, 260, 261, 257/297, 300, 903, E21.645, E21.646, E21.661
See application file for complete search history.

(56) References Cited

U.S. PATENT DOCUMENTS

| | | | |
|---|---|---|---|
| 5,930,163 A | 7/1999 | Hara et al. | |
| 6,597,041 B2 | 7/2003 | Ohbayashi | |
| 6,900,513 B2 | 5/2005 | Natsume | |
| 6,922,354 B2 | 7/2005 | Ishikura et al. | |
| 2004/0211993 A1* | 10/2004 | Ootsuka et al. | 257/288 |
| 2006/0208319 A1* | 9/2006 | Chakihara et al. | 257/369 |
| 2008/0099812 A1* | 5/2008 | Nagata et al. | 257/298 |
| 2008/0116496 A1* | 5/2008 | Tzeng et al. | 257/296 |
| 2009/0039408 A1* | 2/2009 | Hatano et al. | 257/316 |
| 2010/0203672 A1* | 8/2010 | Eun et al. | 438/102 |
| 2011/0101461 A1* | 5/2011 | Takeuchi et al. | 257/368 |
| 2011/0188309 A1* | 8/2011 | Endo | 365/185.05 |
| 2011/0241121 A1* | 10/2011 | Kwon et al. | 257/369 |

* cited by examiner

*Primary Examiner* — S. V Clark

(74) *Attorney, Agent, or Firm* — Sughrue Mion, PLLC

(57) ABSTRACT

An exemplary embodiment of the present invention is a semiconductor device having a regular layout region and an irregular layout region formed on one chip, including: a lower conductive layer; an interlayer insulating film formed on the lower conductive layer; an upper interconnect layer formed on the interlayer insulating film; and connection plugs disposed to electrically connect the lower conductive layer and the upper interconnect layer at a substantially shortest distance. In at least part of the regular layout region, the lower conductive layer and the upper interconnect layer are electrically connected to each other through at least two connection plugs and an intermediate connection layer for electrically connecting the at least two connection plugs, the at least two connection plugs being disposed at an immediately above position extending from immediately above the lower conductive layer and a shift position spaced apart from the immediately above position, respectively.

12 Claims, 33 Drawing Sheets

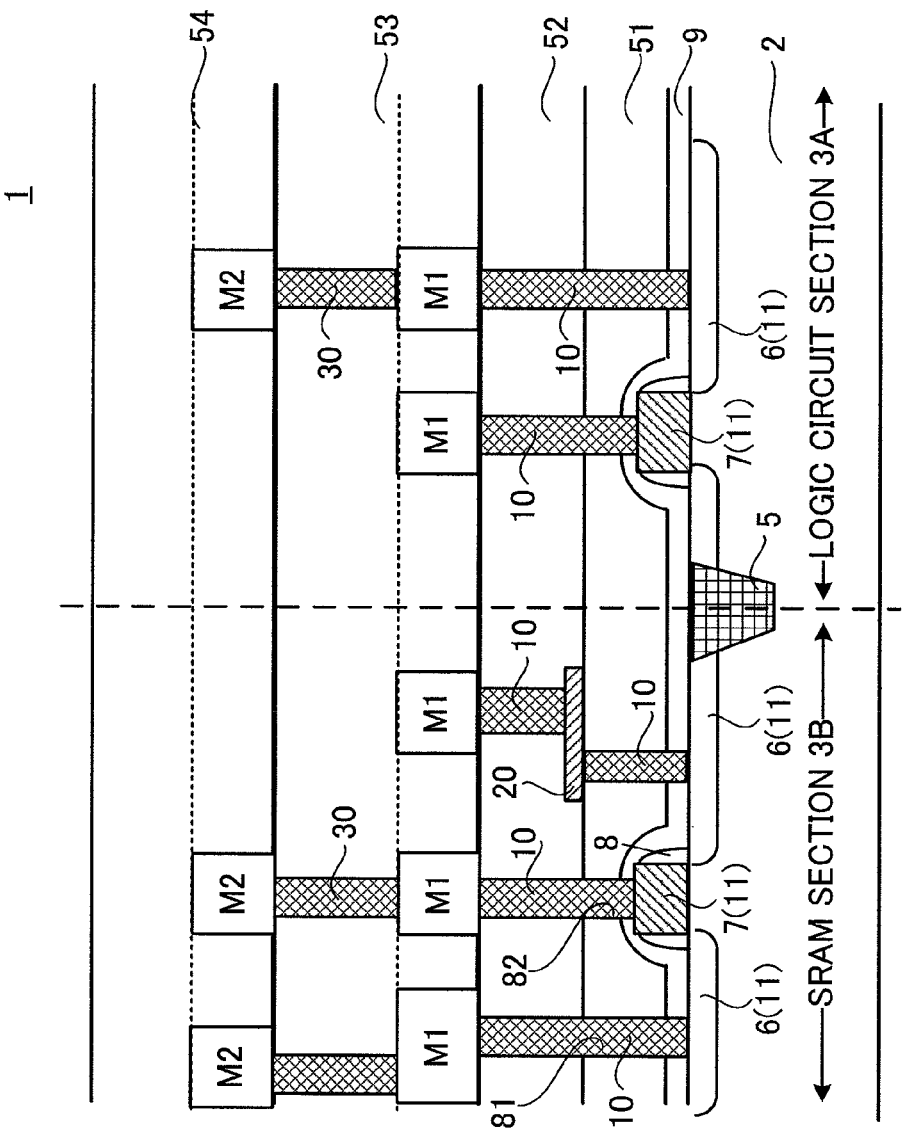

PRIOR ART

SEMICONDUCTOR DEVICE

CROSS REFERENCE OF RELATED ART

This is a Continuation Application of U.S. application Ser. No. 12/615,432 filed Nov. 10, 2009, which claims priority from JP 2008-292034 filed Nov. 14, 2008, the entire contents of which are incorporated herein by reference.

BACKGROUND

1. Field of the Invention

The present invention relates to a semiconductor device, and more particularly, to a semiconductor device including a regular layout region.

2. Description of Related Art

As basic structures of SRAM (Static Random Access Memory) memory cells for use in semiconductor memory devices, there are known a high-resistance load type SRAM including four MOS (Metal Oxide Semiconductor) transistors (two drive MOS transistors and two transfer MOS transistors) and two high-resistance elements, and a CMOS (Complementary Metal Oxide Semiconductor) type SRAM including six MOS transistors (two drive MOS transistors, two load MOS transistors, and two transfer MOS transistors) (e.g., see U.S. Pat. Nos. 5,930,163, 6,900,513, 6,597,041, and 6,922,354). Along with the recent tendency toward the reduction in voltage due to the miniaturization of design rules, CMOS-type SRAMs are widely employed as semiconductor memory devices which are mixed in a logic IC (Integrated Circuit), in view of operating characteristics.

FIG. 30 shows a layout example of a lower conductive layer of a memory cell of a CMOS-type SRAM disclosed in U.S. Pat. No. 5,930,163. The memory cell disclosed in U.S. Pat. No. 5,930,163 includes p-wells and n-wells which are alternately formed in the lateral direction of FIG. 30. N-channel MOS transistors N1 to N4 are formed on the p-wells, and p-channel MOS transistors P1 and P2 are formed on the n-wells. In gate electrode interconnect layers 7 and active regions 6 of the MOS transistors, a large number of M1-connection plugs 10 such as contact holes or via holes are formed so as to be connected with upper-layer interconnections (not shown).

U.S. Pat. No. 6,900,513 proposes a structure capable of downsizing a memory cell. FIG. 31 is a partial sectional view showing a memory cell of a CMOS-type SRAM disclosed in U.S. Pat. No. 6,900,513. The memory cell disclosed in U.S. Pat. No. 6,900,513 includes a semiconductor substrate 2, an isolation region 5, active regions 6, gate electrode interconnect layers 7, connection plugs 10, an intermediate connection layer 20, local interconnections 26 and 27, first interconnect layers M1, a first interlayer insulating film 51, a second interlayer insulating film 52, a third interlayer insulating film 53, and a fourth interlayer insulating film 54. The connection plugs 10 which are substantially concentric with each other are disposed on and below the intermediate connection layer 20. Additionally, the local interconnection 26 connects two active regions 6 spaced from each other, and forms a capacitance with the local interconnection 27.

SUMMARY

FIG. 32 shows an equivalent circuit diagram showing a memory cell of a single-port SRAM of CMOS type. The SRAM memory cell includes six transistors: two p-channel MOS transistors P1 and P2 and four n-channel MOS transistors N1 to N4. The six transistors are connected to a pair of bit lines (DIGT and DIGB) and a word line (WD). The transistors P1 and P2 each function as a load transistor, and the transistors N1 and N2 each function as a drive transistor. The transistors N3 and N4 each function as a transfer transistor. Among the six transistors constituting the SRAM memory cell, the transistors P1 and N1 constitute an inverter and the transistors P2 and N2 also constitute an inverter. The pair of inverters are connected in a crossed manner within the memory cell through a pair of intersecting lines (y1, y2), thereby forming a flip-flop circuit serving as an information storage section that stores 1-bit information.

In the case of forming horizontal SRAM cells, it is necessary to make intersecting connection nodes X1 and X2 of the intersecting lines shown in FIG. 32 close to each other, in order to meet the recent advancement in miniaturization of semiconductor devices. In this case, however, if the intersecting connection nodes X1 and X2 are short-circuited, a fatal defect occurs.

To obtain a close packed layout in the example shown in FIG. 30, it is necessary to make the M1-connection plugs 10, which are disposed between the lower conductive layer and the upper-layer interconnection, close to each other as indicated by the arrow D5 of FIG. 30. This structure causes a deterioration in parasitic capacitance, noise, and operation margin for signal interface. Further, when the M1-connection plugs 10 are made close to each other, a pattern defect is liable to occur, which causes a problem of a deterioration in yield.

A first exemplary aspect of the present invention is a semiconductor device having a regular layout region and an irregular layout region formed on one chip, the semiconductor device including: a lower conductive layer formed within a semiconductor substrate and in close proximity to the semiconductor substrate; an interlayer insulating film formed on the lower conductive layer; an upper interconnect layer formed on the interlayer insulating film; and connection plugs disposed to electrically connect the lower conductive layer and the upper interconnect layer at a substantially shortest distance. In at least part of the regular layout region, the lower conductive layer and the upper interconnect layer are electrically connected to each other through at least two connection plugs and an intermediate connection layer for electrically connecting the at least two connection plugs, the at least two connection plugs being disposed at an immediately above position extending from immediately above the lower conductive layer and a shift position spaced apart from the immediately above position, respectively.

The term "regular layout region" herein described refers to a region having a regular layout such as an SRAM memory cell. A region other than the regular layout region is referred to as "irregular layout region".

According to an exemplary aspect of the present invention, two connection plugs which are disposed at positions where the connection plugs are not overlapped in plan view, and the intermediate connection layer for electrically connecting the two connection plugs are disposed between the lower conductive layer and the upper interconnect layer in the regular layout region. As a result, it is possible to increase a design margin of the layout of the connection plugs to be connected to the upper interconnect layer in the regular layout region, without changing the layout of the lower conductive layer. For example, in a state where the size of the connection plugs to be brought into contact with the lower conductive layer is minimized and the connection plugs are made closest to each other, the connection plugs, which are disposed on the intermediate connection layer, can be spaced apart from each other through the intermediate connection layer. Consequently, a reduction in short-circuit failure or the like caused due to a manufacturing defect in a lithography process, for example, can be achieved. Moreover, the parasitic capacitance can be reduced, and the aspect ratio of the connection plugs can also be reduced. For this reason, the coverage of a barrier metal formed within the connection plugs can be improved. As a result, a reduction in leakage failure and a reduction in resistance of connection plugs can be realized. The above-mentioned effects can be exhibited by applying the above-mentioned structure to the regular layout region.

The present invention has an advantageous effect capable of providing a semiconductor device having high reliability and improved characteristics.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 2A is a partial sectional view schematically showing the semiconductor device according to the first exemplary embodiment;

FIG. 2B is a partially enlarged view showing a connection plug of the semiconductor device according to the first exemplary embodiment;

DETAILED DESCRIPTION OF THE EXEMPLARY EMBODIMENTS

Exemplary embodiments of the present invention will be described below. Note that the sizes of various components described below are shown merely for convenience of explanation and are different from actual ones. The illustration and description of constituent members other than the characterizing portion of the present invention are omitted as appropriate.

First Exemplary Embodiment

Figure 1:
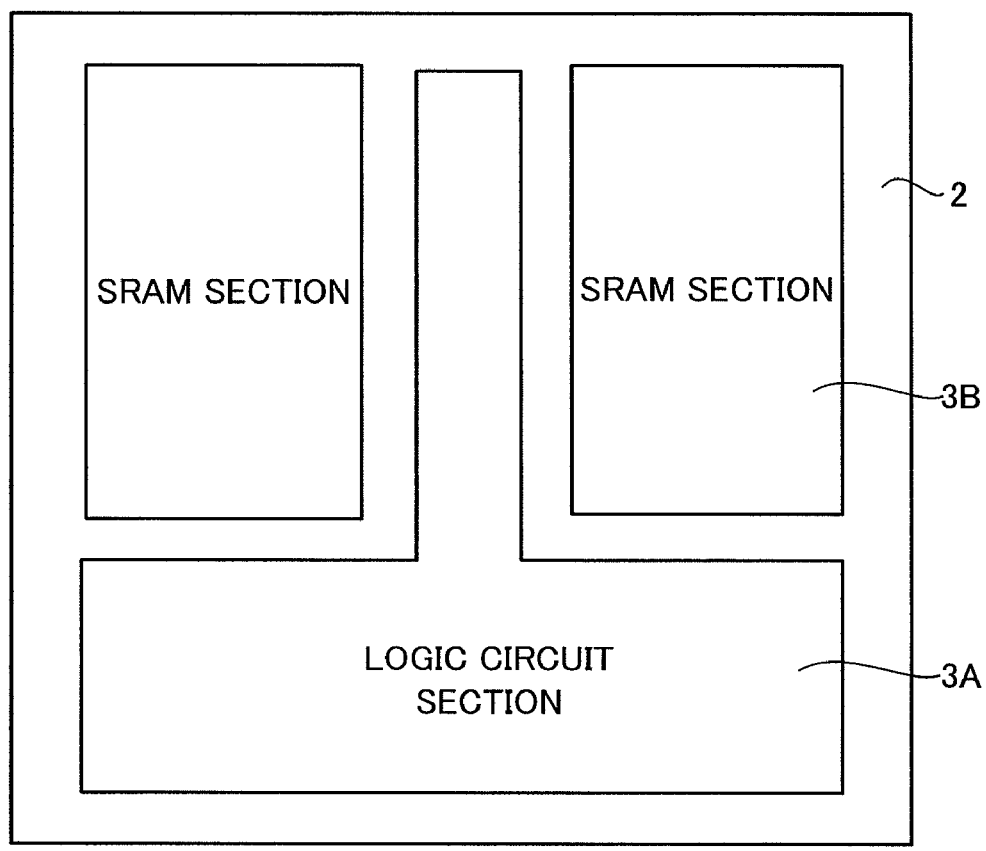
FIG. 1 is a block diagram showing a semiconductor device according to a first exemplary embodiment of the present invention.

FIG. 1 shows an example of a block diagram of a semiconductor device according to a first exemplary embodiment of the present invention. As shown in FIG. 1, a semiconductor device 1 according to the first exemplary embodiment is a so-called SoC (System on a Chip) device including a logic circuit section 3A and two SRAM sections 3B each serving as a memory section. The logic circuit section 3A and the two SRAM sections 3B are formed on a semiconductor substrate 2. Each of the SRAM sections 3B includes a memory cell region, a decoder region, and a memory control circuit region. In the memory cell region, a plurality of memory cells 4 is arranged in a matrix. In the first exemplary embodiment, the memory cells 4 correspond to a regular layout region. The logic circuit section corresponds to an irregular layout region.

FIG. 2A shows a partial sectional view schematically showing the SRAM section 3B and the logic circuit section 3A of the semiconductor device 1 according to the first exemplary embodiment. FIG. 2B shows a partially enlarged view showing a connection plug. As shown in FIG. 2A, the semiconductor device 1 includes the semiconductor substrate 2, an isolation region 5, active regions 6, gate electrode interconnect layers 7, side walls 8, a silicon nitride film 9, first interconnect layers M1 and second interconnect layers M2 each of which is an upper interconnect layer, first interconnect layer-connection plugs (hereinafter referred to as "M1-connection plug(s)") 10, an intermediate connection layer 20, second interconnect layer-connection plugs (hereinafter referred to as "M2-connection plug(s)") 30, a first interlayer insulating film 51, a second interlayer insulating film 52, a third interlayer insulating film 53, and a fourth interlayer insulating film 54. Among conductive layers formed below the first interconnect layer M1, conductive layers other than the intermediate connection layer 20 (e.g., the active regions 6 and the gate electrode interconnect layers 7) are hereinafter collectively called a lower conductive layer 11. Additionally, the first interconnect layers M1 and upper interconnect layers are also collectively called an upper interconnect layer.

In general, each of the M1-connection plugs 10, the M2-connection plugs 30, and the like includes a barrier metal 12 formed so as to coat the bottom surface and side wall portions of a connection hole as shown in FIG. 2B. For example, titanium (Ti) or titanium nitride (TiN) can be applied as the barrier metal 12. Further, a connection plug 13 made of tungsten (W), for example, is disposed in the connection hole which is coated with the barrier metal 12, thereby forming each of the M1-connection plugs 10. A coverage failure of the barrier metal 12 causes an increase in contact resistance and junction leakage.

In the logic circuit section 3A, the lower conductive layer 11 and the first interconnect layer M1 are connected to each other through the M1-connection plug 10 which extends immediately above the lower conductive layer 11. Meanwhile, the lower conductive layer 11 and the first interconnect layer M1 of the SRAM section 3B are connected, in some parts, through the M1-connection plug 10, which extends immediately above the lower conductive layer 11, in the manner as described above, and are connected, in other parts, by the following structure. That is, the lower conductive layer 11 and part of the first interconnect layer M1 of the SRAM section 3B are connected together with the intermediate connection layer 20. Further, the position of the M1-connection plug 10 formed on the intermediate connection layer 20 is shifted from a position immediately above the lower conductive layer 11. In other words, the M1-connection plugs 10 are disposed on and below the intermediate connection layer 20 so as not to be overlapped with each other in plan view. Note that "the position where the connection plugs are not overlapped with each other in plan view" refers to a position where the M1-connection plugs 10 disposed on and below the intermediate connection layer are not substantially concentric with each other when a plurality of M1-connection plugs 10 is disposed.

The formation of the intermediate connection layer 20 makes it possible to reduce the aspect ratio of the M1-connection plugs 10. Accordingly, the coverage of the barrier metal formed within the connection plugs can be improved. As a result, a reduction in leakage failure and a reduction in resistance of connection plugs can be realized. Additionally, the formation of the intermediate connection layer 20 makes it possible to increase the degree of freedom of design in determining the position for forming each M1-connection plug 10. For example, two connection plugs formed on the intermediate connection layer 20 can be shifted in the direction in which they are spaced apart from each other, in a state where the sizes of the connection plugs in contact with the active regions 6 are minimized and adjacent connection plugs in contact with the active regions 6 are arranged in closest proximity to each other. As a result, a reduction in short-circuit failure or the like caused due to a manufacturing defect in a lithography process, for example, can be achieved. Moreover, the parasitic capacitance can be reduced.

Figure 32:
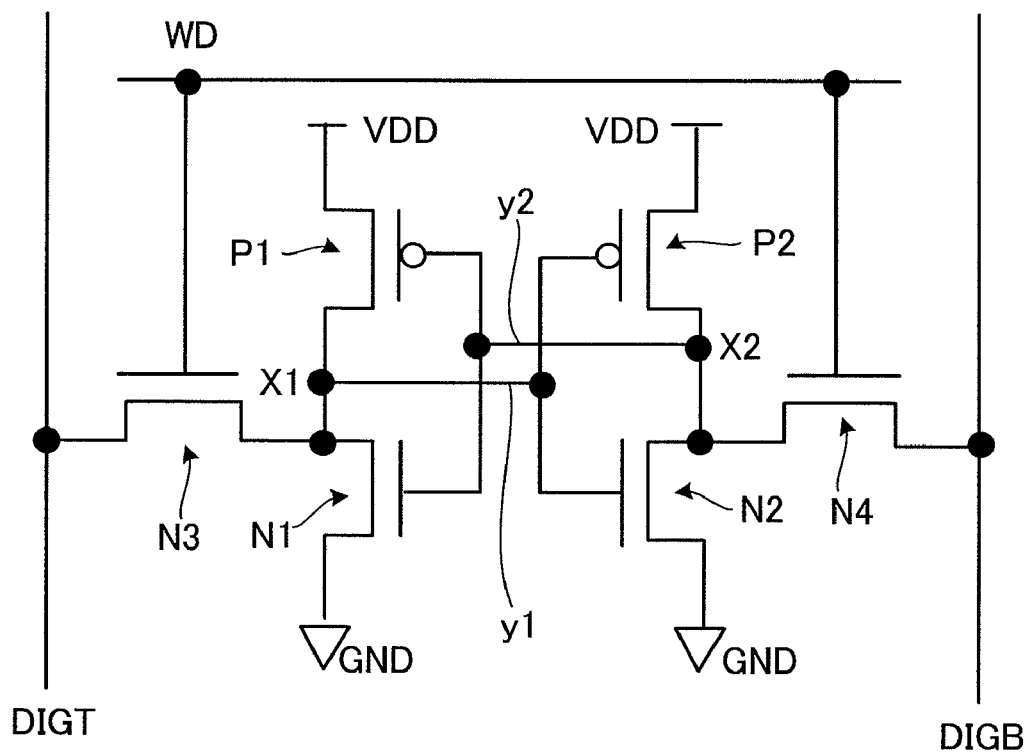
FIG. 32 is an equivalent circuit diagram showing a memory cell of a single-port SRAM.

Next, specific arrangement examples of the intermediate connection layer 20 will be described with reference to the layout of the memory cell 4 of the SRAM section 3B shown in FIGS. 3 to 6. Note that, for convenience of explanation, illustration of the side walls 8, the silicon nitride film 9, the interlayer insulating films, and the like is omitted as appropriate in the drawings. Note that the equivalent circuit diagram showing the SRAM section 3B according to the first exemplary embodiment is similar to FIG. 32.

Figure 3A:
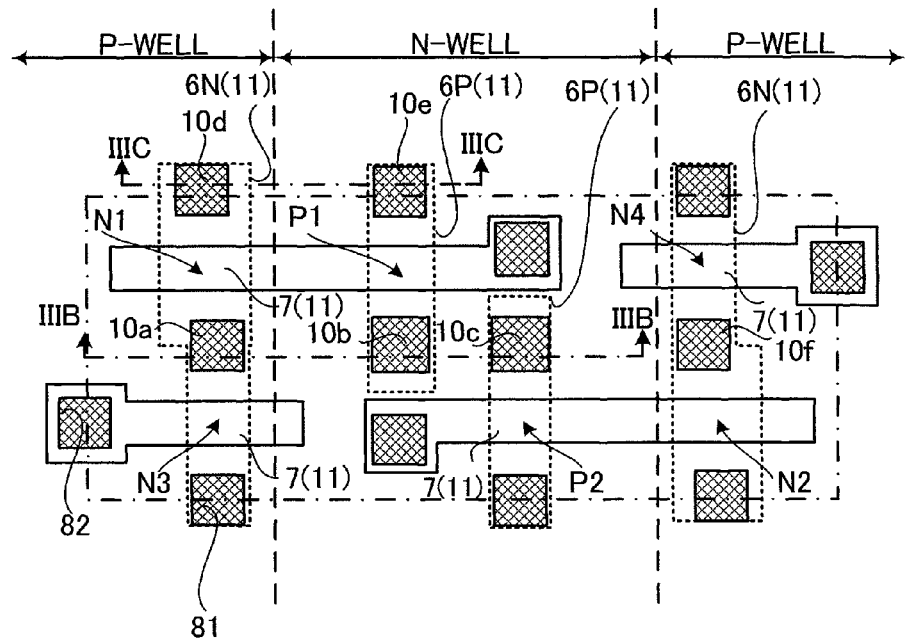
FIG. 3A is a top view showing a memory cell according to the first exemplary embodiment.
Figure 3B:
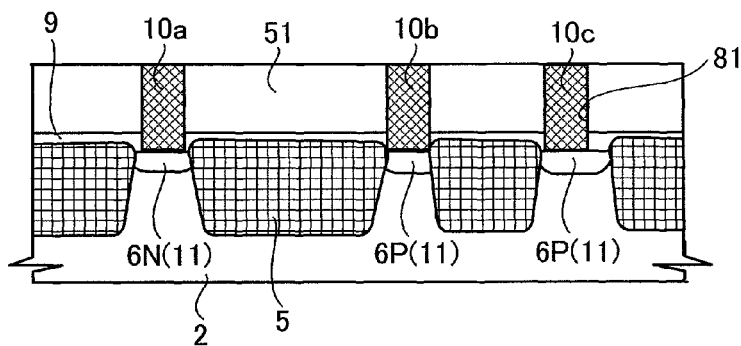
FIG. 3B is a sectional view taken along the line IIIB-IIIB of FIG. 3A.
Figure 3C:
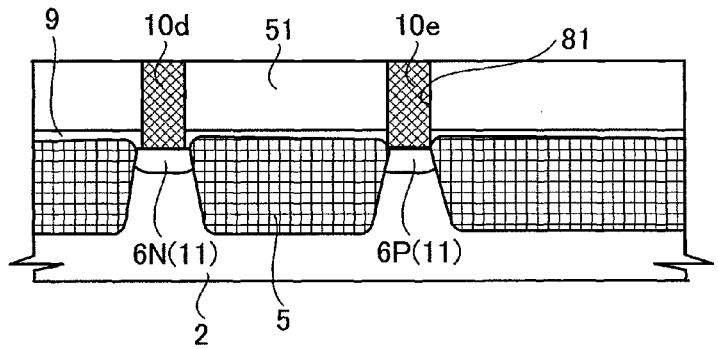
FIG. 3C is a sectional view taken along the line IIIC-IIIC of FIG. 3A.

FIG. 3A is a top view showing a state where the lower conductive layer 11 such as the active regions 6 and the gate electrode interconnect layers 7 which are formed on the surface of the semiconductor substrate 2, and the M1-connection plugs 10 are formed. FIG. 3B is a sectional view taken along the line IIIB-IIIB of FIG. 3A. FIG. 3C is a sectional view taken along the line IIIC-IIIC of FIG. 3A.

As shown in FIG. 3A, an n-well region in which p-channel MOS transistors P1 and P2 are formed is located in a central area. A p-well region in which re-channel MOS transistors N1 and N3 are formed and a p-well region in which re-channel MOS transistors N2 and N4 are formed are located on both sides of the n-well region. As described above, each of the transistors P1 and P2 functions as a load transistor, and each of the transistors N1 and N2 functions as a drive transistor. Each of the transistors N3 and N4 functions as a transfer transistor. A pair of drive transistors and a pair of load transistors constitute a flip-flop circuit serving as an information storage section that stores 1-bit information. The flip-flop circuit is composed of a pair of CMOS inverters, and each of the CMOS inverters is composed of a single drive transistor N1 (N2) and a single load transistor P1 (P2).

The six transistors constituting the memory cell are formed in the active region 6 which is a diffusion region surrounded by the isolation region 5 that is formed on the semiconductor substrate 2 made of monocrystalline silicon. The active region 6 includes an n-type active region 6N and a p-type active region 6P. Each transistor includes a source/drain region formed in the active region, a gate insulating film (not shown) formed on the surface of the active region, and the gate electrode interconnect layer 7 formed on the gate insulating film.

The gate electrode interconnect layer 7 has a stacked structure of, for example, a doped polycrystalline silicon film and a refractory metal silicide film (a titanium silicide film, a cobalt silicide film, a nickel silicide film, or the like), or a metal gate structure. On the side walls of the gate electrode interconnect layer 7, the side walls 8 are formed (see FIG. 2A). Additionally, at the upper portion of the gate electrode interconnect layer 7, a silicon nitride film (not shown) is formed. Note that a metal silicide layer may be formed on the silicon surface of the active regions 6N and 6P.

The first interlayer insulating film 51 is formed on the silicon nitride film 9. As shown in FIG. 3B, the first interlayer insulating film 51 has connection holes 81 formed through the first interlayer insulating film 51 from the surface thereof to reach the active regions 6N and 6P. M1-connection plugs 10a, 10b, and 10c are disposed in the connection holes 81. Likewise, as shown in FIG. 3C, the first interlayer insulating film 51 has the connection holes 81 formed through the first interlayer insulating film 51 from the surface thereof to reach the active regions 6N and 6P, and M1-connection plugs 10d and 10e are disposed in the connection holes 81. The M1-connection plugs 10 may be applied with tungsten, for example. In general, the barrier metal 12 as shown in FIG. 2B is formed within the connection holes 81. The first interlayer insulating film 51 has connection holes 82 penetrating through the surface of the gate electrode interconnect layer 7, and the M1-connection plugs 10 are disposed in the connection holes 82 in a similar manner as described above (see FIG. 2A).

Figure 4A:
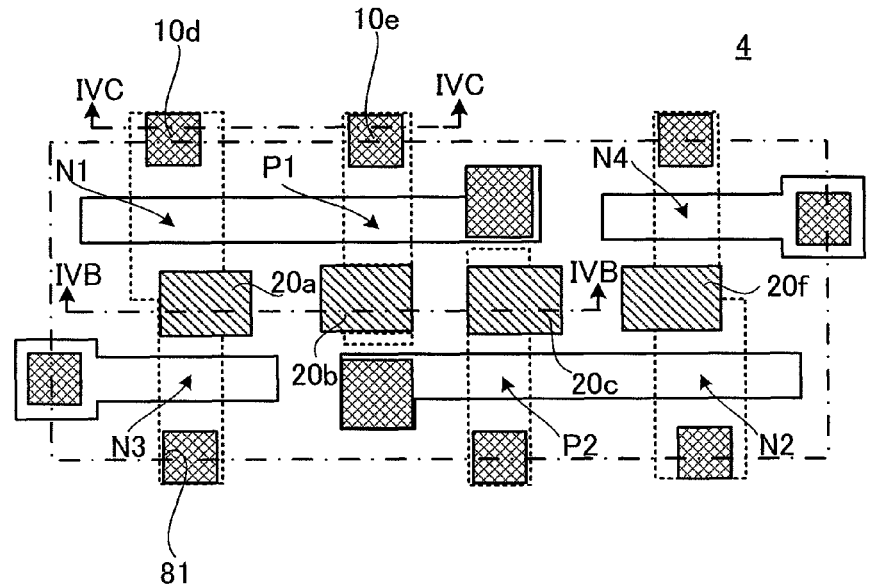
FIG. 4A is a top view showing the memory cell according to the first exemplary embodiment.
Figure 4B:
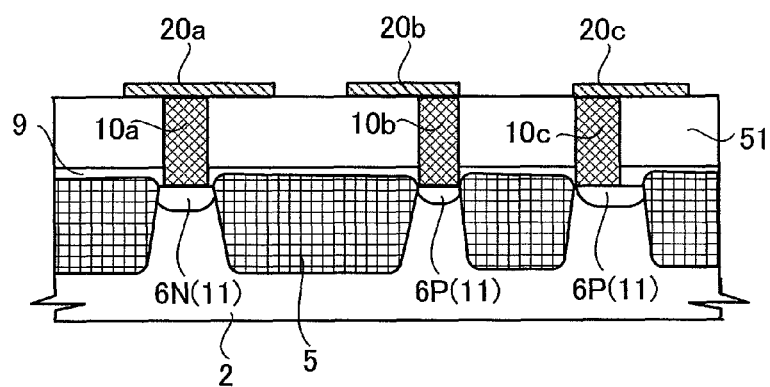
FIG. 4B is a sectional view taken along the line IVB-IVB of FIG. 4A.
Figure 4C:
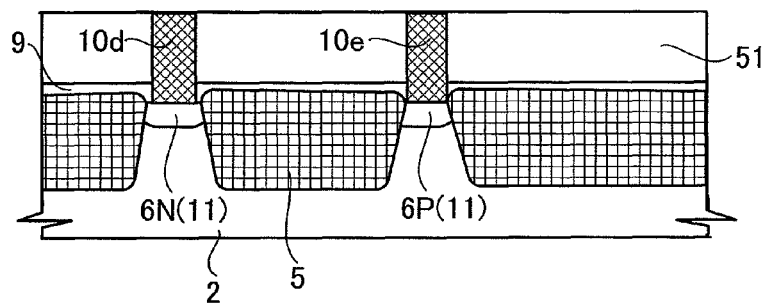
FIG. 4C is a sectional view taken along the line IVC-IVC of FIG. 4A.

FIG. 4A is a top view showing a state where the intermediate connection layers 20 are formed for the structure shown in FIG. 3A. FIG. 4B is a sectional view taken along the line IVB-IVB of FIG. 4A. FIG. 4C is a sectional view taken along the line IVC-IVC of FIG. 4A.

The intermediate connection layers 20 are formed immediately above the M1-connection plugs 10a, 10b, 10c, and 10f (see FIG. 3A) so as to coat the M1-connection plugs (see FIG. 4A). Specifically, intermediate connection layers 20a, 20b, 20c, and 20f are formed immediately above the M1-connection plugs 10a, 10b, 10c, and 10f, respectively. Among the intermediate connection layers, patterns of at least the intermediate connection layers 20b and 20c are formed so that the intermediate connection layers 20b and 20c are aligned with the M1-connection plugs 10b and 10c, respectively, in the layout, on the side where the M1-connection plugs 10b and 10c formed below the intermediate connection layers 20b and 20c face each other. In other words, the intermediate connection layers 20b and 20c are coated so as not to project from the M1-connection plugs 10b and 10c on the side where the M1-connection plugs 10b and 10c formed therebelow face each other, and so as not to expose the M1-connection plugs 10b and 10c. As a result, as shown in FIG. 4B, a distance between the M1-connection plug 10b and the M1-connection plug 10c is substantially the same as a distance between the intermediate connection layer 20b and the intermediate connection layer 20c.

Each of the intermediate connection layers 20a and 20c has an extended region which extends rightward in FIG. 4A, and each of the intermediate connection layers 20b and 20f has an extended region which extends leftward in FIG. 4A. The intermediate connection layer 20 may have a thickness smaller than that of the upper interconnect layer such as the first interconnect layer M1. Accordingly, the intermediate connection layer 20 can be formed not only by a typical Cu-Damascene Process, but also by a sputtering method, a CVD method, and the like. The material is not particularly limited, and metals such as tungsten, titanium nitride (TiN), and copper, or conductive films equivalent to metals can be applied, for example. From the viewpoint of reducing the resistance, low-resistance conductive films may preferably be used.

The thickness of the intermediate connection layer 20 is not particularly limited, but may be preferably reduced without sacrificing superior film formation characteristics, in view of the pattern accuracy. Though the thickness is determined depending on the material to be used and the required resistance characteristics, the thickness may be about ½ to ¼ of that of the first interconnect layer M1, for example.

In the first exemplary embodiment, a description has been given of the example where the intermediate connection layer 20 is formed only immediately above the four M1-connection plugs 10a, 10b, 10c, and 10f among the M1-connection plugs 10 of the memory cell region. This embodiment is illustrative only, and the positions and the number of the intermediate connection layers 20 may be arbitrarily determined.

Figure 5A:
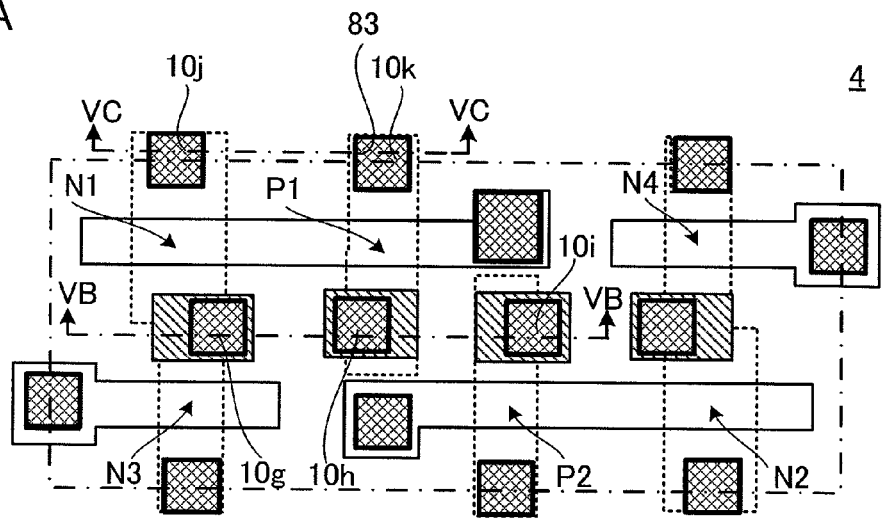
FIG. 5A is a top view showing the memory cell according to the first exemplary embodiment.
Figure 5B:
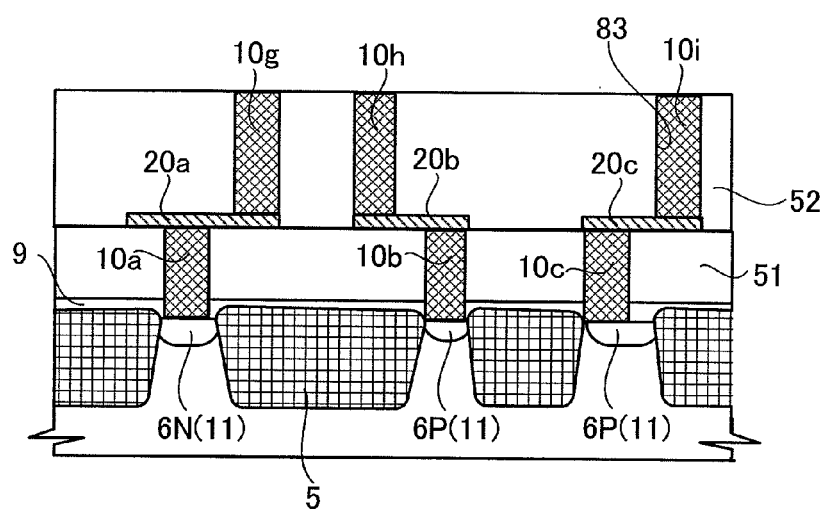
FIG. 5B is a sectional view taken along the line VB-VB of FIG. 5A.
Figure 5C:
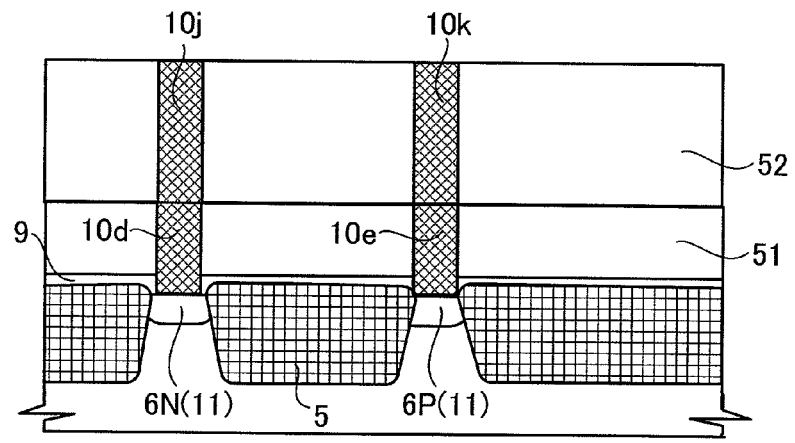
FIG. 5C is a sectional view taken along the line VC-VC of FIG. 5A.

FIG. 5A is a top view showing a state where there are formed the second interlayer insulating film 52, connection holes 83 penetrating from the surface of the second interlayer insulating film 52 to the surface of the intermediate connection layer 20 or the M1-connection plugs 10 which is formed in the first interlayer insulating film 51, and the M1-connection plugs 10 which are disposed in the connection holes 83. FIG. 5B is a sectional view taken along the line VB-VB of FIG. 5A. FIG. 5C is a sectional view taken along the line VC-VC of FIG. 5A.

As shown in FIG. 5B, an M1-connection plug 10g is disposed on the intermediate connection layer 20a so as not to be overlapped in plan view with the M-connection plug 10a which is disposed below the intermediate connection layer 20a. In other words, the position of the M1-connection plug 10g, which is formed on the intermediate connection layer 20a, is shifted rightward in FIG. 5B with respect to the position where the M1-connection plug 10a is formed below the intermediate connection layer 20a. Likewise, an M1-connection plug 10h is disposed on the extended region of the intermediate connection layer 20b which extends leftward in FIG. 5B, so as not to be overlapped in plan view with the M1-connection plug 10b which is disposed below the intermediate connection layer 20b. Further, an M1-connection plug 1i formed on the intermediate connection layer 20c is disposed on the extended region which extends rightward in FIG. 5B, so as not to be overlapped in plan view with the M1-connection plug 10c which is disposed below the intermediate connection layer 20c. Note that the phrase "connection plugs are disposed so as not to be overlapped in plan view" refers to the state where the M1-connection plugs disposed on and below the intermediate connection layer (e.g., M1-connection plugs 10a and 10g, 10b and 10h, and 10c and 10i) are not substantially concentric with each other. The shift amount thereof is not particularly limited.

As shown in FIG. 5C, M1-connection plugs 10*j* and 10*k* are disposed immediately above the M1-connection plugs 10*d* and 10*e*, respectively, without involving the intermediate connection layer.

Figure 6:
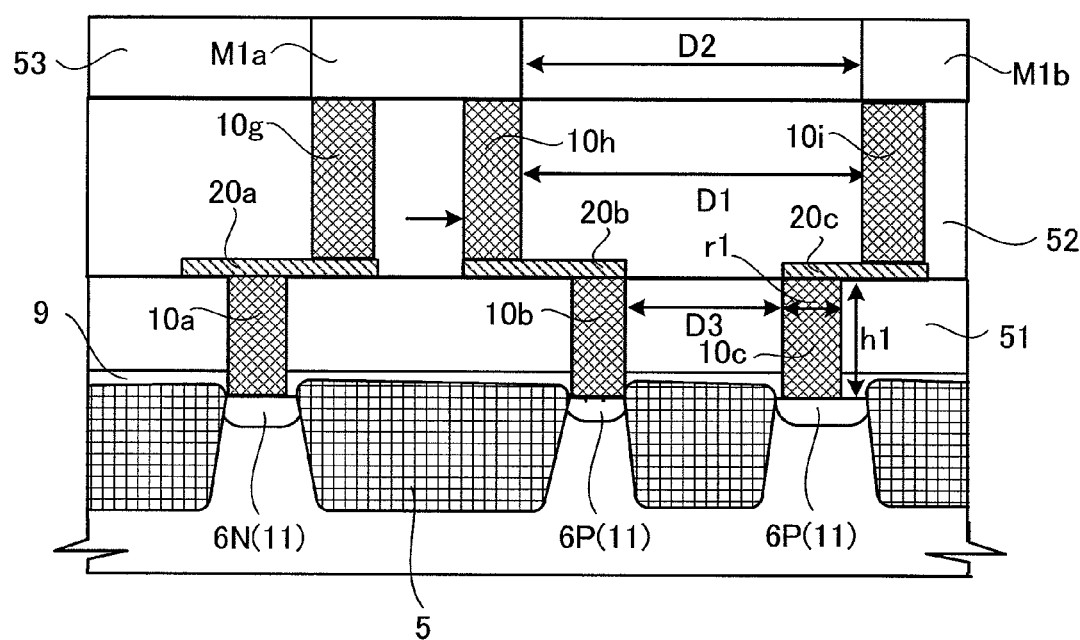
FIG. 6 is a sectional view showing a state where layers up to a first interconnect layer of the memory cell according to the first exemplary embodiment are formed.

FIG. 6 is a sectional view showing a state where the first interconnect layers M1 are further formed on the second interlayer insulating film 52 in a region corresponding to the sectional view of FIG. 5B. On the M1-connection plugs 10*g* and 10*h*, a pattern of a first interconnect layer M1*a* is formed so as to electrically connect the M1-connection plugs 10*g* and 10*h*. Further, on the M1-connection plug 10*i*, a pattern of a first interconnect layer M1*b*, which is different from the pattern of the first interconnect layer M1*a*, is formed.

In this case, as shown in FIG. 6, a distance between the M1-connection plug 10*h* and 10*i* is represented by D1; a distance between the first interconnect layers M1*a* and M1*b* is represented by D2; and a distance between the M1-connection plugs 10*b* and 10*c* is represented by D3. In the example shown in FIG. 6, the formation of the intermediate connection layers 20*b* and 20*c* makes it possible to increase the distance D1 between the M1-connection plugs 10*h* and 10*i* while allowing the M1-connection plugs 10*b* and 10*c*, which are positioned below the intermediate connection layers, to be disposed at the immediately above positions extending from immediately above the active regions 6. This also contributes to an increase in the distance D2 between the first interconnect layers M1*a* and M1*b*.

Figure 33:
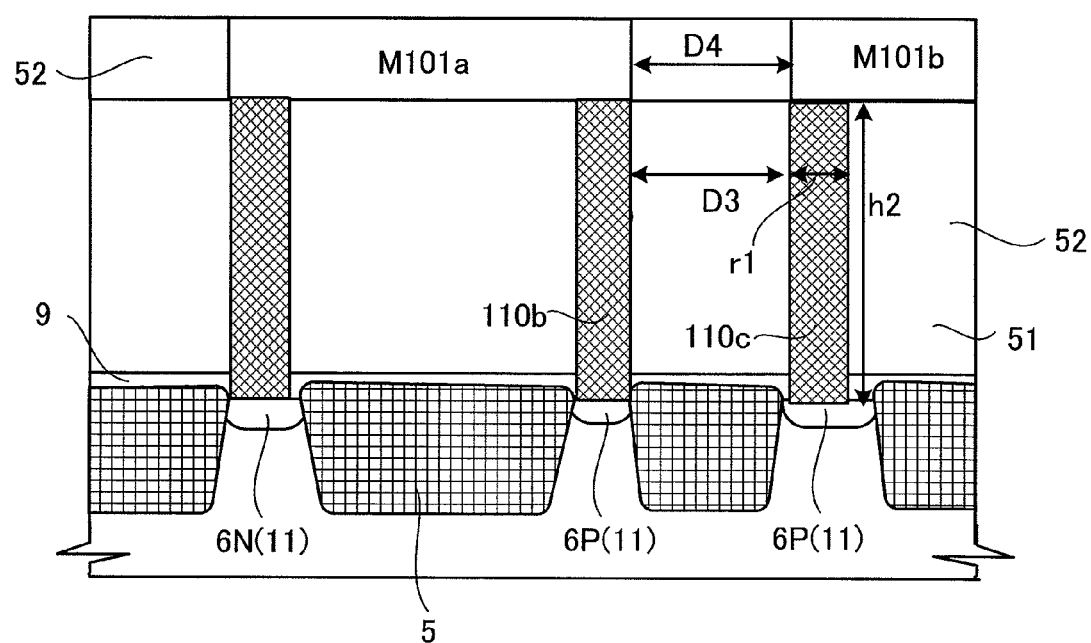
FIG. 33 is a sectional view showing a state where layers up to a first interconnect layer of a memory cell according to a comparative example of the present invention are formed.

As a comparative example, consideration is given to a case where first interconnect layers M101*a* and M101*b* are connected to the active regions 6 with the M1-connection plugs, without forming the intermediate connection layer. Reference is now made to FIG. 33 which is a sectional view showing a case where the intermediate connection layer is not formed at positions corresponding to those of the FIG. 6. In this case, a distance between M1-connection plugs 110*b* and 110*c* is represented by D3 in the same manner as in the first exemplary embodiment. A distance between the first interconnect layers M101*a* and M101*b* is represented by D4. Since the intermediate connection layer is not formed, the distance D4 is at least the same as the distance D3 or shorter than the distance D3. When the distance D3 is set to be shortest by using microfabrication technology and M1-connection plugs 110 are minimized, there is fear that the yield is deteriorated due to pattern defects.

On the other hand, in the first exemplary embodiment, the distance D2 between the patterns of the first interconnect layers M1*a* and M1*b* can be increased in a state where the sizes of the connection plugs in contact with the active regions 6 are minimized and adjacent connection plugs in contact with the active region 6 are arranged in closest proximity to each other. In other words, distance D4 (distance between the M1-interconnect layers M101*a* and M101*b* of the comparative example)<distance D2 (distance between the M1-connection layers M1*a* and M1*b* of the first exemplary embodiment) is satisfied. As a result, a reduction in short-circuit failure or the like caused due to a manufacturing defect in a lithography process, for example, can be achieved. Accordingly, the problem of deterioration in yield and performance of the SRAM due to miniaturization can be solved. Furthermore, the intermediate connection layer 20 is formed to change the connection between the M1-connection plugs, which results in a reduction of the aspect ratio of the M1-connection plugs. In other words, (an aspect ratio h2/r1 of the M1-connection plugs according to the comparative example) >(an aspect ratio h1/r1 of the M1-connection plugs according to an exemplary embodiment of the present invention) is satisfied. Accordingly, a taper angle obtained by processing the connection holes and the coverage of the barrier metal which forms the M1-connection plugs can be improved. As a result, a suppression of a leakage failure and a reduction in connection resistance can be realized.

According to the first exemplary embodiment, the positions to be connected with the upper interconnect layer can be adjusted without changing the layout of the lower conductive layers of the transistors in which the area of the memory cell 4 is reduced. This contributes to an increase in degree of freedom of design. Therefore, the space between the connection holes can be widened and the limitations on the shape and layout of the upper interconnect layer by the layout of the lower layers can be alleviated. As a result, the deterioration in yield and operation margin due to pattern defects caused by lithography or the like, a parasitic capacitance, noise, signal interference, or the like due to the layout can be reduced or improved, while achieving the miniaturization of the SRAM.

Second Exemplary Embodiment

Next, a description is given of an exemplary embodiment of a semiconductor device which is different from the above-mentioned exemplary embodiment. Note that components identical with those of the above-mentioned exemplary embodiment are denoted by the same reference symbols, and the description thereof is omitted as appropriate.

The basis structure of a semiconductor device according to a second exemplary embodiment of the present invention is similar to that of the first exemplary embodiment, except for the following. That is, in the semiconductor device 1 according to the first exemplary embodiment, the connection holes 81 and 82 are formed at the positions where the intermediate connection layer 20 is not formed, after the formation of the first interlayer insulating film 51, and the M1-connection plugs 10 (e.g., 10*a* to 10*f*) are disposed. Then, after the formation of the second interlayer insulating film 52, the connection holes 83 are formed and the M1-connection plugs 10 (e.g., 10*g* to 10*i*) are disposed. Meanwhile, in the semiconductor device according to the second exemplary embodiment, after the first interlayer insulating film 51 and the second interlayer insulating film 52 are formed at the positions where the intermediate connection layer is not formed, connection holes penetrating from the surface of the second interlayer insulating film 52 to the lower conductive layer 11 which is formed below the first interlayer insulating film 51 are formed, and then the M1-connection plugs 10 are disposed.

Figure 7A:
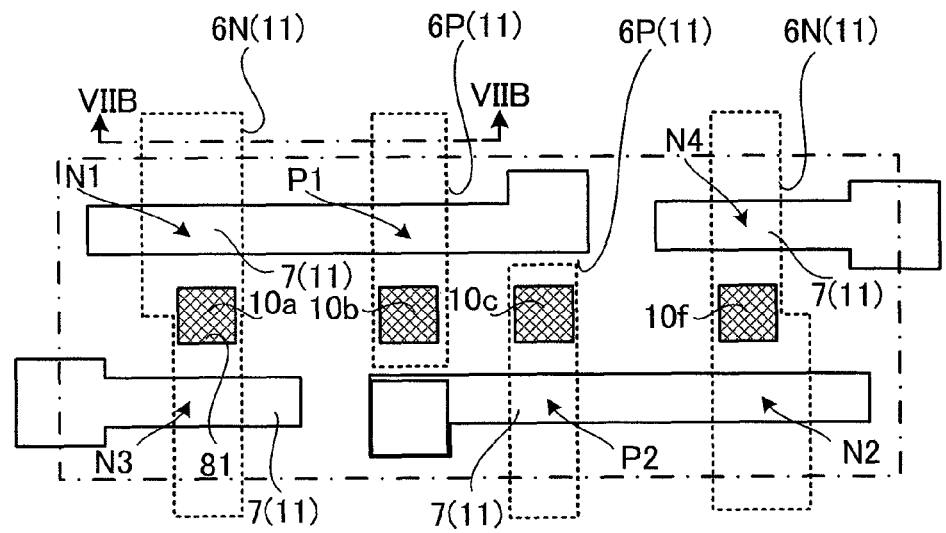
FIG. 7A is a top view showing a memory cell according to a second exemplary embodiment of the present invention.
Figure 7B:
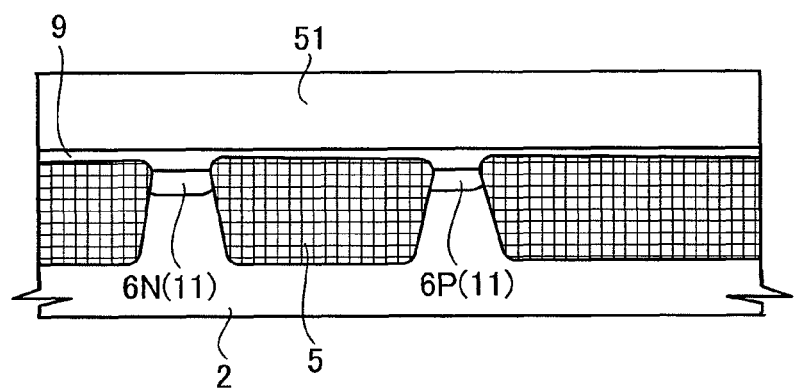
FIG. 7B is a sectional view taken along the line VIIB-VIIB of FIG. 7A.

The layout of a memory cell in the SRAM section of the semiconductor device according to the second exemplary embodiment will be described with reference to FIGS. 7A to 8B. FIG. 7A is a top view showing a memory cell 204 in a state where the lower conductive layer 11, such as the active regions 6 and the gate electrode interconnect layers 7 formed on the surface of the semiconductor substrate 2, and the M1-connection plugs 10 are formed. FIG. 7B is a sectional view taken along the line VIIB-VIIB of FIG. 7A.

As shown in FIG. 7B, the first interlayer insulating film 51 has the connection holes 81 penetrating from the surface thereof to the active regions 6N and 6P. The M1-connection plugs 10*a*, 10*b*, 10*c*, and 10*f* are disposed in the connection holes 81. Meanwhile, the first interlayer insulating film 51 in the other regions has no connection hole as shown in FIG. 7B, unlike the first exemplary embodiment.

Figure 8A:
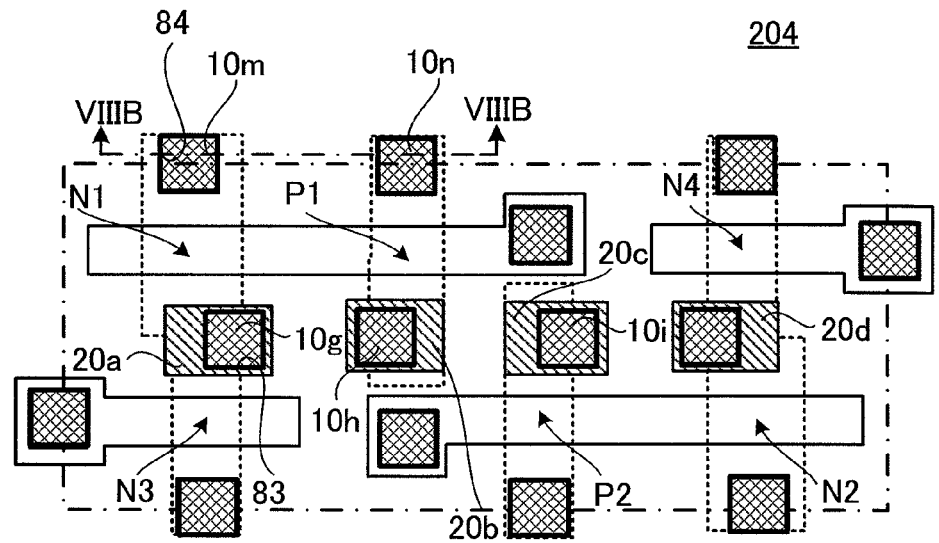
FIG. 8A is a top view showing the memory cell according to the second exemplary embodiment.
Figure 8B:
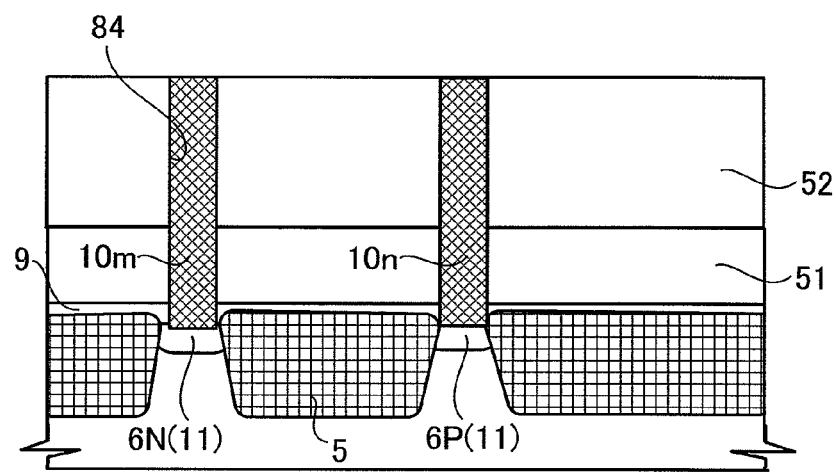
FIG. 8B is a sectional view taken along the line VIIIB-VIIIB of FIG. 8A.

FIG. 8A is a top view showing the memory cell 204 in a state where the second interlayer insulating film 52 is formed and the M1-connection plugs 10 are disposed on the surface of the second interlayer insulating film 52. FIG. 8B is a sectional view taken along the line VIIIB-VIIIB of FIG. 8A.

As shown in FIG. 8A, the intermediate connection layers 20 are formed immediately above the M1-connection plugs 10a, 10b, 10c, and 10f (see FIG. 3A) so as to coat the M1-connection plugs. Further, as in FIG. 5B, the corresponding M1-connection plug 10g, 10h, and 10i are formed on the intermediate connection layers 20a, 20b, and 20c, respectively, in a similar manner as in the first exemplary embodiment. Meanwhile, as shown in FIG. 8B, at the positions where the M1-connection plugs 10d, 10e, 10j, and 10k are disposed in the first exemplary embodiment, M1-connection plugs 10m and 10n are formed in connection holes 84 penetrating from the surface of the second interlayer insulating film 52 to the active regions 6 which are formed below the first interlayer insulating film 51.

According to the second exemplary embodiment, the same effects as those of the first exemplary embodiment can be obtained by forming the intermediate connection layer 20. Further, only the particular contacts in the memory cell section are formed in a minimum size, and the other contacts having a design margin in the memory cell are formed with a size that is common to the logic circuit section which has a size greater than the minimum size. As a result, the production yield can be improved.

Third Exemplary Embodiment

The basic structure of a semiconductor device according to a third exemplary embodiment of the present invention is similar to that of the first exemplary embodiment, except for the following. That is, in the semiconductor device 1 according to the first exemplary embodiment, the intermediate connection layer 20 is formed only in the region in which the arrangement positions of the M1-connection plugs 10 are intended to be shifted from the immediately above positions extending from immediately above the lower conductive layer 11. Meanwhile, in the semiconductor device according to the third exemplary embodiment, the intermediate connection layer 20 is formed at all the positions where the M1-connection plugs 10 are disposed in a gap between the first interlayer insulating film 51 and the second interlayer insulating film 52.

Figure 9:
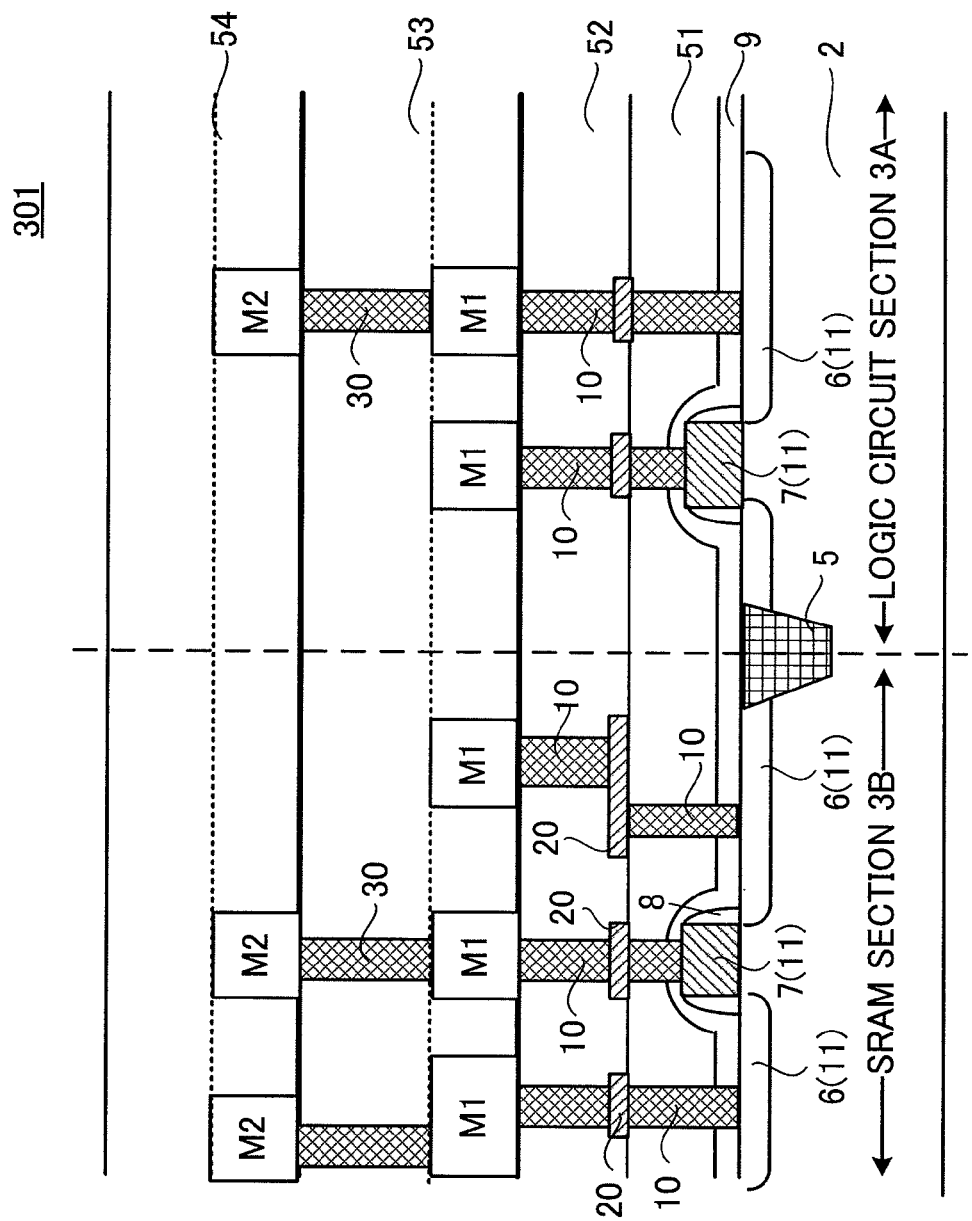
FIG. 9 is a partially enlarged sectional view schematically showing a semiconductor device according to a third exemplary embodiment of the present invention.

Reference is now made to FIG. 9 which is a partial sectional view schematically showing the SRAM section 3B and the logic circuit section 3A of a semiconductor device 301 according to the third exemplary embodiment. In the logic circuit section 3A, the lower conductive layer and the first interconnect layers M1 are connected together through the M1-connection plugs 10 which extend immediately above the lower conductive layer. Additionally, the intermediate connection layer 20 is disposed between each of the M1-connection plugs 10 which are disposed in the connection holes formed in the first interlayer insulating film 51 and each of the M1-connection plugs 10 which are disposed in the connection holes formed in the second interlayer insulating film 52. The intermediate connection layer 20 has a rectangular pattern which has a size equal to or larger than that of an exposed portion of each connection plug so as to coat the M1-connection plugs 10 formed on the surface of the first interlayer insulating film 51.

In the SRAM section 3B, in a similar manner as in the first exemplary embodiment, the intermediate connection layer 20 is formed in the region in which the M1-connection plugs 10 are intended to be shifted from the immediately above positions extending immediately above the lower conductive layer 11, and the following structure is also included. That is, as in the logic circuit section 3A according to the third exemplary embodiment, the SRAM section 3B includes the intermediate connection layer 20 for connecting each of the M1-connection plugs 10 which are disposed in the connection holes formed in the first interlayer insulating film 51 and each of the M1-connection plugs 10 which are disposed in the connection holes formed in the second interlayer insulating film 52. The M1-connection plugs 10 are disposed so as to be overlapped with each other in plan view.

Figure 10A:
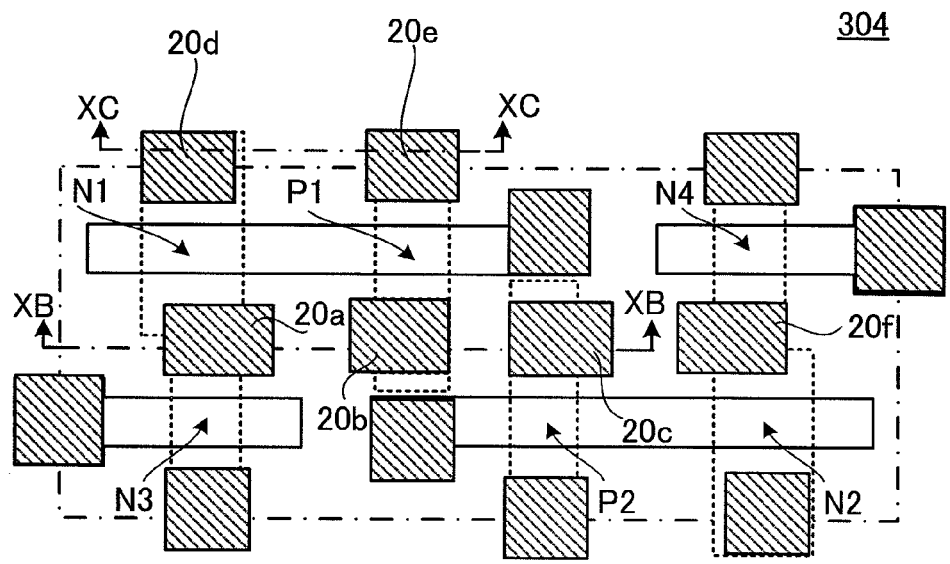
FIG. 10A is a top view showing a memory cell according to the third exemplary embodiment.
Figure 10B:
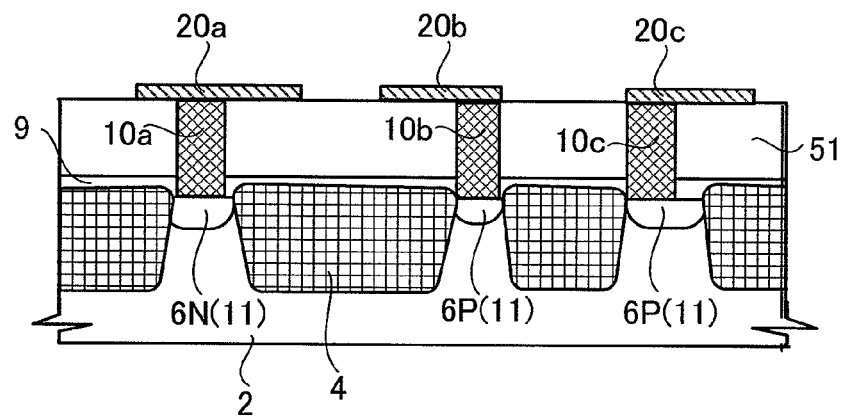
FIG. 10B is a sectional view taken along the line XB-XB of FIG. 10A.
Figure 10C:
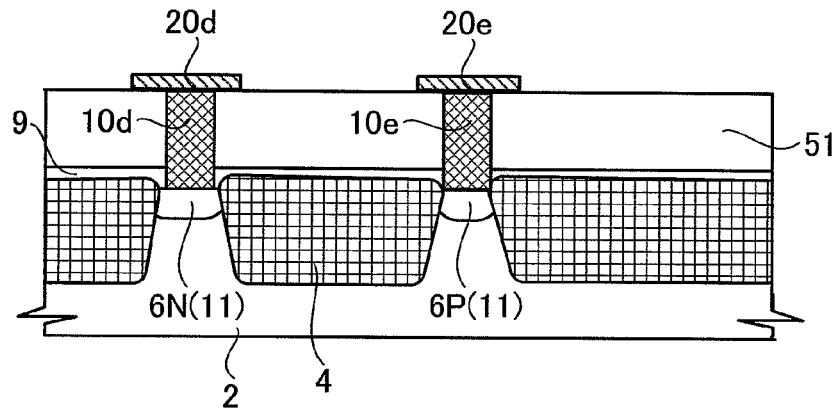
FIG. 10C is a sectional view taken along the line XC-XC of FIG. 10A.

FIG. 10A is a top view showing a state where layers up to the intermediate connection layer 20 are formed on the semiconductor substrate 2. FIG. 10B is a sectional view taken along the line XB-XB of FIG. 10A. FIG. 10C is a sectional view taken along the line XC-XC of FIG. 10A.

As shown in FIG. 10A, the intermediate connection layers 20 are formed immediately above the M1-connection plugs 10a, 10b, 10c, and 10f (see FIG. 3A) so as to coat the M1-connection plugs. Specifically, the intermediate connection layers 20a, 20b, 20c, and 20f are formed immediately above the M1-connection plugs 10a, 10b, 10c, and 10f, respectively. The patterns of the intermediate connection layers 20a, 20b, 20c, and 20f are formed to have a size greater than that of an exposed area of each M1-connection plug 10 formed therebelow. Further, in a similar manner as in the first exemplary embodiment, the patterns of at least the intermediate connection layers 20b and 20c among the intermediate connection layers are formed so that the intermediate connection layers 20b and 20c are aligned with the M1-connection plugs 10b and 10c, respectively, in the layout, on the side where the M1-connection plugs 10b and 10c formed below the intermediate connection layers 20b and 20c face each other. Moreover, each of the intermediate connection layers 20a and 20c has an extended region which extends rightward in FIG. 4B, and each of the intermediate connection layers 20b and 20f has an extended region which extends leftward in FIG. 4A.

Also in the M1-connection plugs 10 other than the M1-connection plugs 10a, 10b, 10c, and 10f described above, corresponding intermediate connection layers 20 are formed. At these positions, the intermediate connection layers 20 have a size equal to or larger than that of the M1-connection plugs 10 so as to coat the M1-connection plugs 10 which are exposed to the surface of the first interlayer insulating film 51. For example, intermediate connection layers 20d and 20e which have a size larger than that of the corresponding M1-connection plugs 10 are formed on the M1-connection plugs 10d and 10e shown in FIG. 10C, respectively, so as to coat the region exposed to the surface of the first interlayer insulating film 51.

According to the third exemplary embodiment, the same effects as those of the first exemplary embodiment can be obtained by forming the intermediate connection layer 20. Further, the intermediate connection layer is formed at the positions to be connected with the M1-connection plugs which are formed in the first interlayer insulating film 51 and the second interlayer insulating film 52. As a result, the sizes of the connection plugs formed on and below the intermediate connection layer can be changed, thereby making it possible to improve the layout design and the aspect ratio depending on the required characteristics. Furthermore, defects due to displacement of the connection holes formed in each layer can be reduced.

Fourth Exemplary Embodiment

The basic structure of a semiconductor device according to a fourth exemplary embodiment of the present invention is similar to that of the first exemplary embodiment, except for the following. That is, in the semiconductor device 1 according to the first exemplary embodiment, the intermediate connection layer 20 is formed only in the region in which the arrangement positions of the M1-connection plugs 10 are intended to be shifted from the immediately above positions extending from immediately above the lower conductive layer 11. Meanwhile, in the semiconductor device according to the fourth exemplary embodiment, the intermediate connection layers 20 are formed at the above-mentioned positions as well as arbitrary positions for disposing the M1-connection plugs 10 in a gap between the first interlayer insulating film 51 and the second interlayer insulating film 52.

Figure 11A:
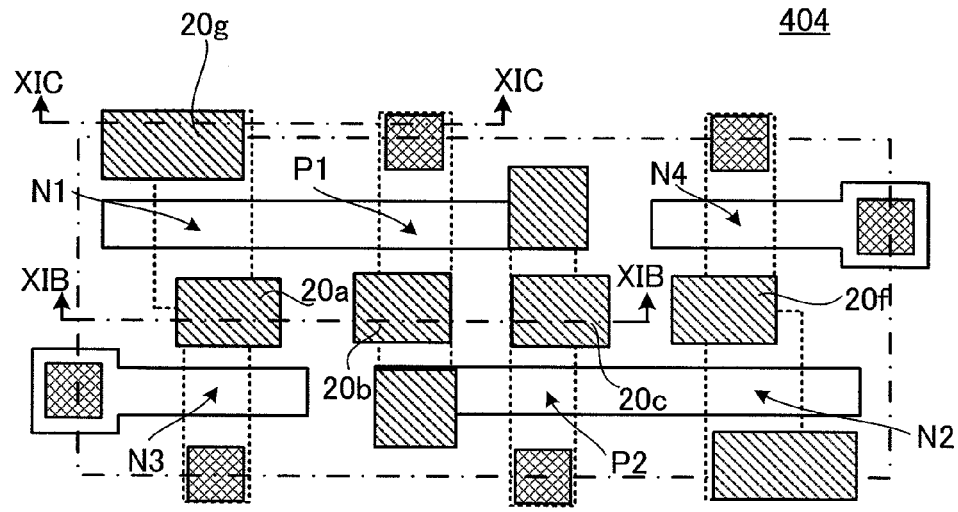
FIG. 11A is a top view showing a memory cell according to a fourth exemplary embodiment of the present invention.
Figure 11B:
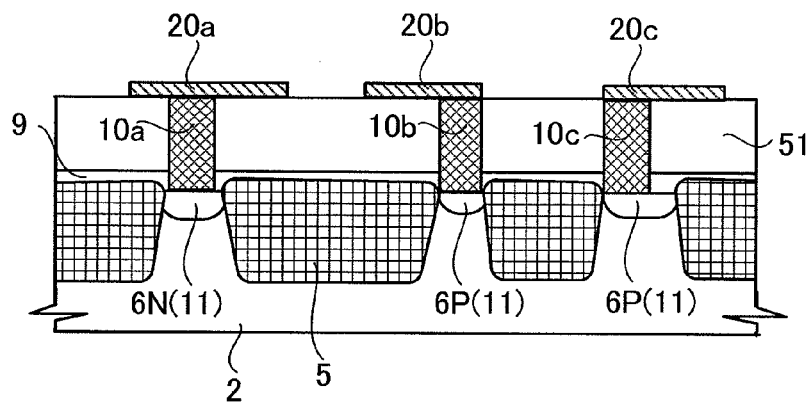
FIG. 11B is a sectional view taken along the line XIB-XIB of FIG. 11A.
Figure 11C:
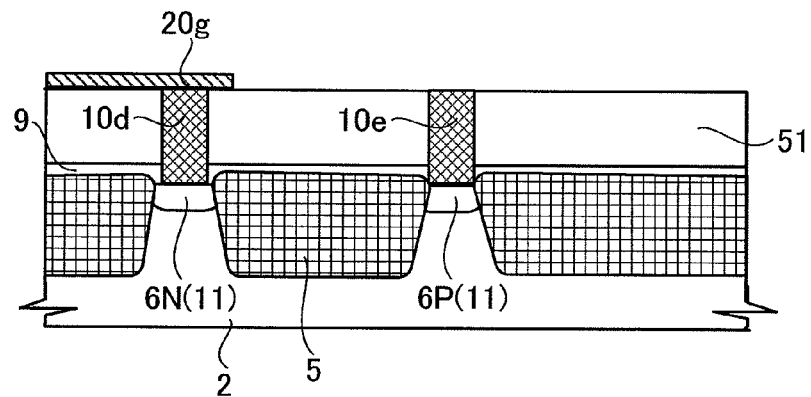
FIG. 11C is a sectional view taken along the line XIC-XIC of FIG. 11A.

FIG. 11A is a top view showing a memory cell 404 in a state where layers up to the intermediate connection layers 20 are formed on the semiconductor substrate 2. FIG. 11B is a sectional view taken along the line XIB-XIB of FIG. 11A. FIG. 11C is a sectional view taken along the line XIC-XIC of FIG. 11A.

In a similar manner as in the first exemplary embodiment, the intermediate connection layers 20 are formed immediately above the M1-connection plugs 10a, 10b, 10c, and 10f (see FIG. 3A) so as to coat the M1-connection plugs (see FIG. 11A). Specifically, the intermediate connection layers 20a, 20b, 20c, and 20f are formed immediately above the M1-connection plugs 10a, 10b, 10c, and 10f, respectively.

Further, at arbitrary positions of the M1-connection plugs 10 other than the M1-connection plugs 10a, 10b, 10c, and 10f, the intermediate connection layers 20 are formed. At these positions, the intermediate connection layers 20 having a size equal to or larger than that of the M1-connection plugs 10 may be formed so as to coat the M1-connection plugs 10 which are exposed to the surface of the first interlayer insulating film 51. Alternatively, the intermediate connection layers 20 having an extended region, such as the intermediate connection layers 20a, 20b, 20c, and 20f, may be formed.

As a result, the same effects as those of the first exemplary embodiment can be obtained. Moreover, the arrangement positions of the intermediate connection layers 20 can be arbitrarily set, which significantly increases the degree of freedom of design. For example, the intermediate connection layers 20 can be formed in a region in which small-size connection plugs are formed, a region in which there arises a problem of parasitic capacitance, or a region in which connection plugs are adjacent to each other. In a region in which there are no problems as mentioned above, the connection plugs can be directly connected together without forming any intermediate connection layer, or the one connection plug can be disposed from the lower conductive layer to the surface of the second interlayer insulating film.

Thus, the semiconductor device can be designed in the optimum state, depending on specific usage, needs, and specifications.

Fifth Exemplary Embodiment

The basic structure of a semiconductor device according to a fifth exemplary embodiment of the present invention is similar to that of the first exemplary embodiment, except for the following. That is, in the semiconductor device 1 according to the first exemplary embodiment, the M1-connection plugs 10 to be connected to the lower conductive layer are disposed at each connecting location. Meanwhile, in the semiconductor device 1 according to the fifth exemplary embodiment, some M1-connection plugs 10 to be connected to the lower conductive layer are used as common connection plugs.

Figure 12A:
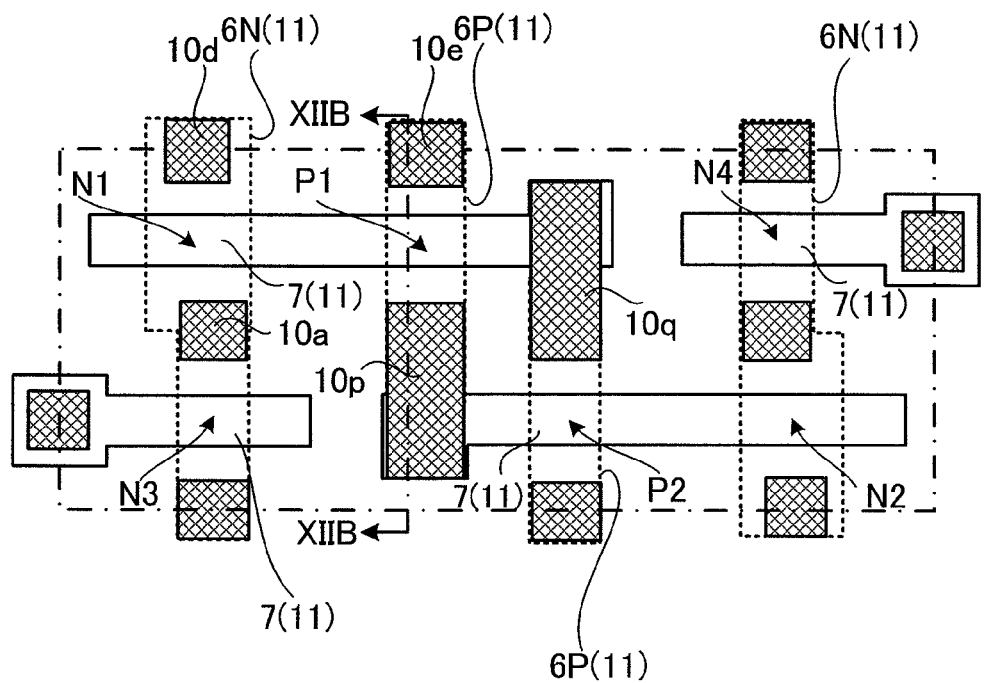
FIG. 12A is a top view showing a memory cell according to a fifth exemplary embodiment of the present invention.
Figure 12B:
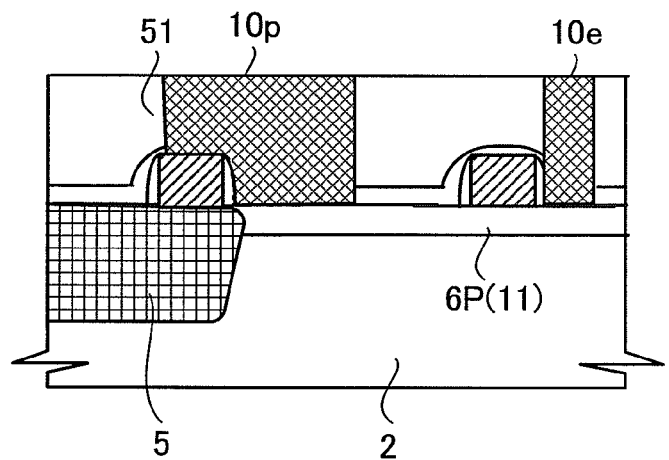
FIG. 12B is a sectional view taken along the line XIIB-XIIB of FIG. 12A.

FIG. 12A shows a top view showing a memory cell 504 in a state where layers up to the first interlayer insulating film 51 and the M1-connection plugs 10 are formed on the semiconductor substrate 2. FIG. 12B is a sectional view taken along the line XIIB-XIIB of FIG. 12A.

In the fifth exemplary embodiment, the M1-connection plug 10b of the first exemplary embodiment shown in FIG. 3A is integrated with the M1-connection plug 10 which is located adjacent to the M1-connection plug 10b on the lower side of FIG. 3A, thereby forming a common connection plug 10p (see FIG. 12B). Further, the M1-connection plug 10f of the first exemplary embodiment shown in FIG. 3A is integrated with the M1-connection plug 10 which is located adjacent to the M1-connection plug 10f on the upper side of FIG. 3A, thereby forming a common connection plug 10q.

Figure 13A:
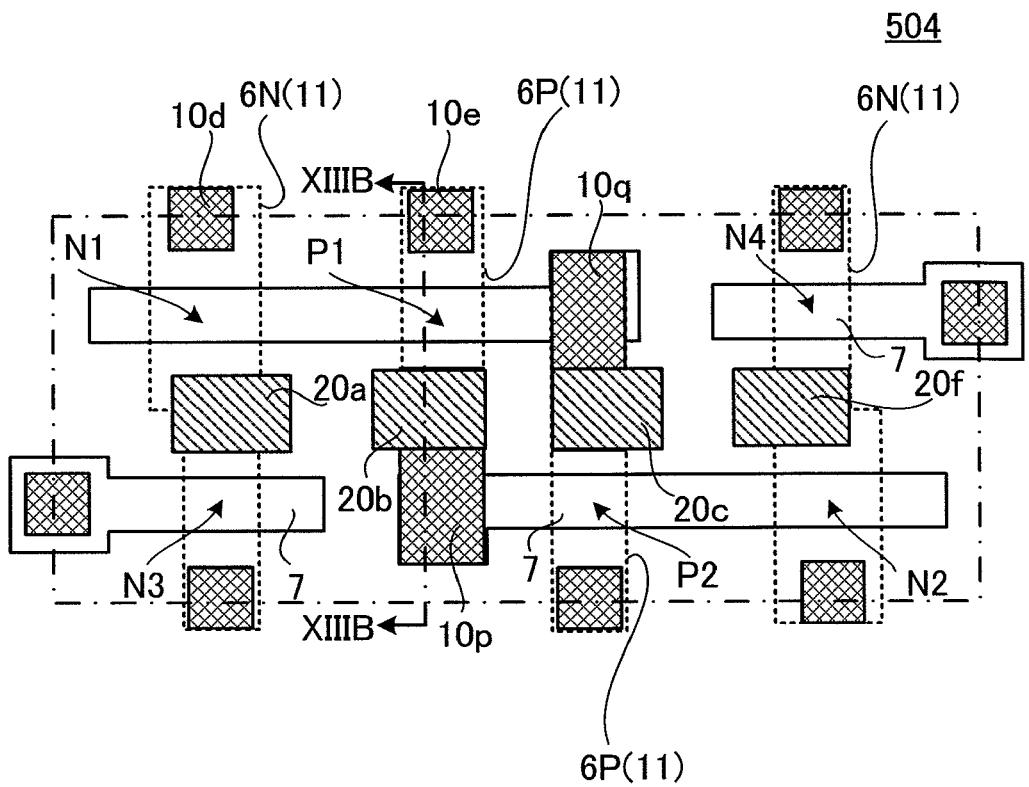
FIG. 13A is a top view showing the memory cell according to the fifth exemplary embodiment.
Figure 13B:
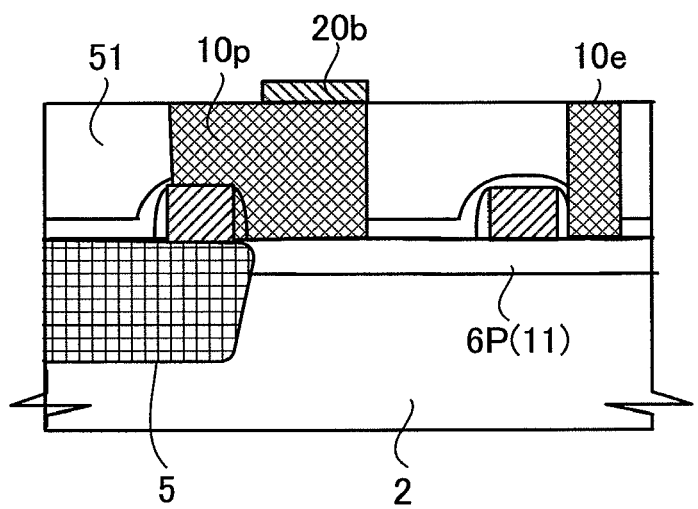
FIG. 13B is a sectional view taken along the line XIIIB-XIIIB of FIG. 13A.

FIG. 13A is a top view showing a state where the intermediate connection layers 20 are further formed in the structure shown in FIG. 12A. FIG. 13B is a sectional view taken along the line XIIIB-XIIIB of FIG. 13A. The arrangement positions and shapes of the intermediate connection layers 20a, 20b, 20c, and 20f are similar to those of the first exemplary embodiment. In the fifth exemplary embodiment, the intermediate connection layer 20 is formed so as to be in contact with a certain region of the upper surface of the M1-connection plug 10p (see FIGS. 13A and 13B). Likewise, the intermediate connection layer 20 is formed so as to be in contact with a certain region of the upper surface of the M1-connection plug 10q.

Figure 14A:
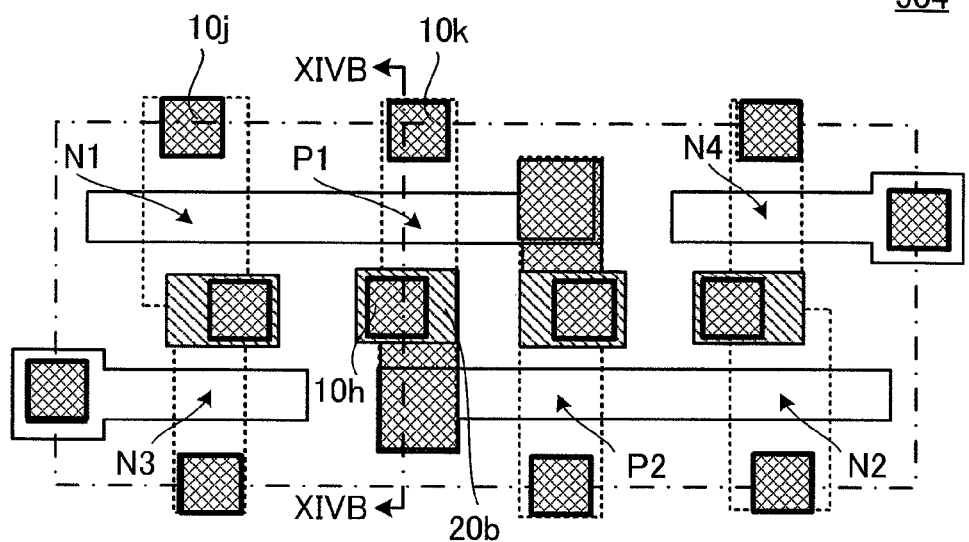
FIG. 14A is a top view showing the memory cell according to the fifth exemplary embodiment.
Figure 14B:
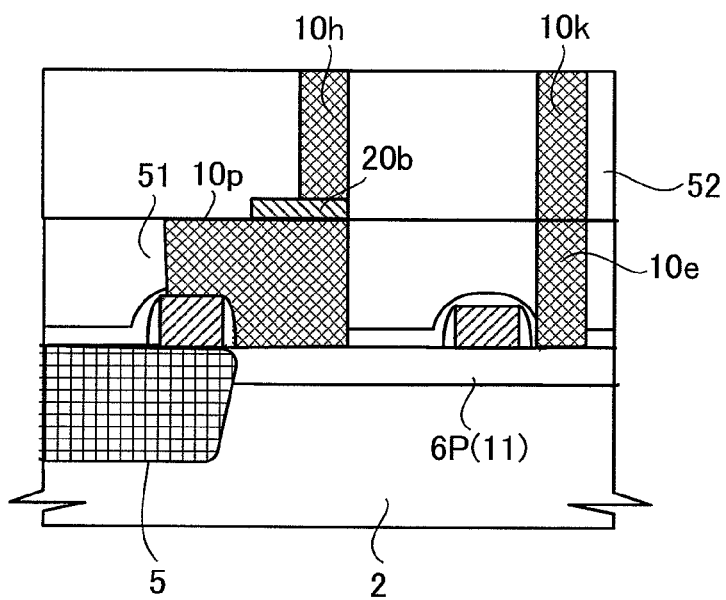
FIG. 14B is a sectional view taken along the line XIVB-XIVB of FIG. 14A.
Figure 15A:
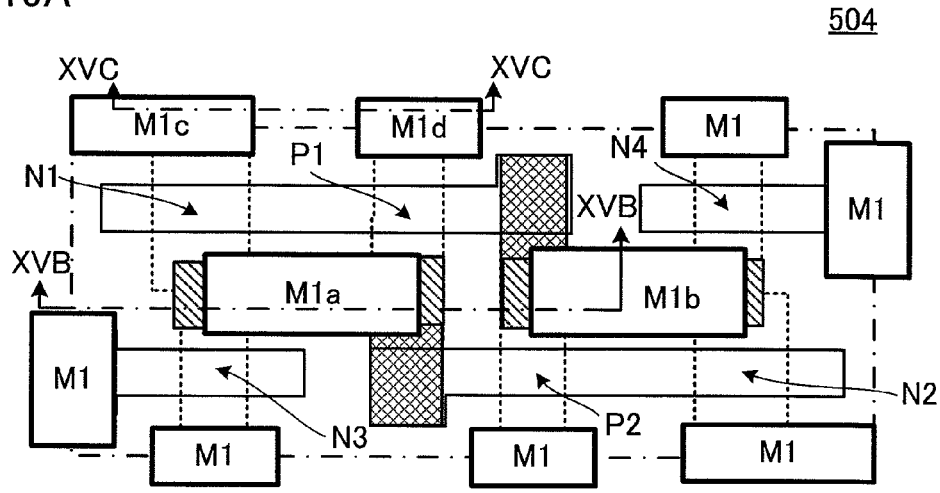
FIG. 15A is a top view showing the memory cell according to the fifth exemplary embodiment.
Figure 15B:
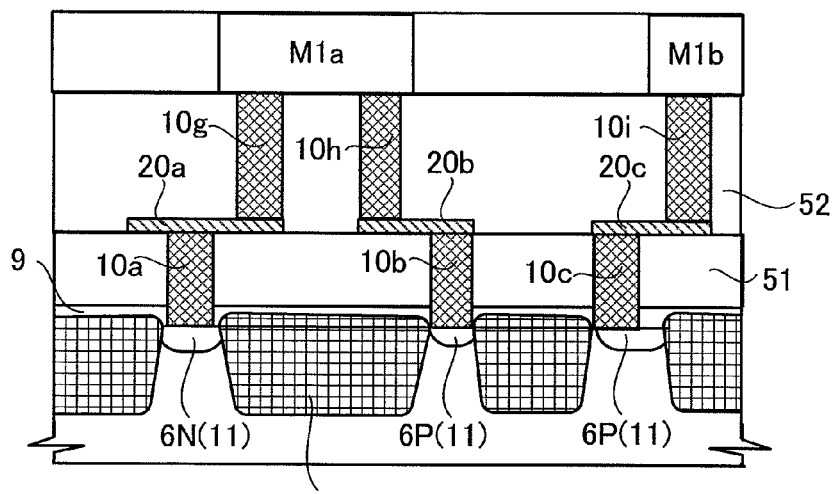
FIG. 15B is a sectional view taken along the line XVB-XVB of FIG. 15A.
Figure 15C:
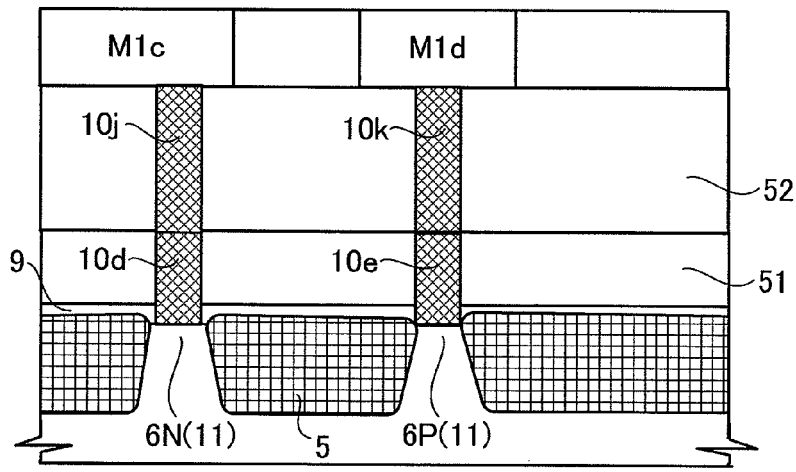
FIG. 15C is a sectional view taken along the line XVC-XVC of FIG. 15A.
Figure 16A:
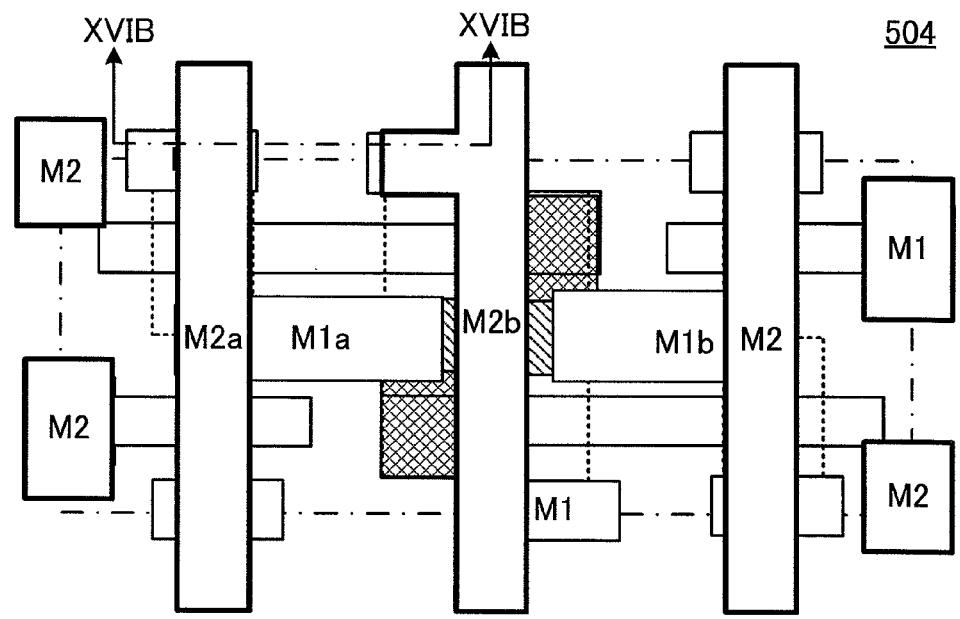
FIG. 16A is a top view showing the memory cell according to the fifth exemplary embodiment.

FIG. 14A is a top view showing a state where the second interlayer insulating film 52 is formed and the M1-connection plugs 10 are formed in the connection holes of the second interlayer insulating film 52. FIG. 14B is a sectional view taken along the line XIVB-XIVB of FIG. 14A. FIG. 15A is a top view showing a state where layers up to the first interconnect layers M1 are formed. FIG. 15B is a sectional view taken along the line XVB-XVB of FIG. 15A, and FIG. 15C is a sectional view taken along the line XVC-XVC of FIG. 15A. FIG. 16A is a top view showing a state where layers up to the second interconnect layers M2 are formed, and FIG. 16B is a sectional view taken along the line XVIB-XVIB of FIG. 16A.

The second interlayer insulating film 52 is formed so as to coat the upper layer of the M1-connection plugs 10 which are exposed to the surface of the first interlayer insulating film 51 and to coat the intermediate connection layer 20 formed on a portion of the upper layer (see FIG. 14B). The second interlayer insulating film 52 has connection holes for connecting the M1-connection plugs 10 of the first interlayer insulating film 51 or the intermediate connection layer 20 formed above M1-connection plugs 10. The M1-connection plugs 10 are formed in the connection holes. Specifically, as shown in FIG. 14B, the M1-connection plug 10p, which is a common connection plug formed in the first interlayer insulating film 51, and the M1-connection plug 10h, which is formed in the second interlayer insulating film 52, are connected together through the intermediate connection layer 20b. Further, the M1-connection plug 10e, which is a common connection plug formed in the first interlayer insulating film 51, and the M1-connection plug 10k, which is formed in the second interlayer insulating film 52, are directly connected together.

The first interconnect layers M1 are formed on the M1-connection plugs 10 which are exposed to the surface of the second interlayer insulating film 52 (see FIG. 15A). As shown in FIG. 15B, the pattern of the first interconnect layer M1a is formed on the M1-connection plugs 10g and 10h, which are formed in the second interlayer insulating film 52, so as to coat both the M1-connection plugs 10g and 10h. Further, the pattern of the first interconnect layer M1b is formed on the M1-connection plug 10i, which is formed in the second interlayer insulating film 52, so as to coat the M1-connection plug 10i. Furthermore, as shown in FIG. 15C, first interconnect layers M1c and M1d are respectively formed on the M1-connection plugs 10j and 10k, which are formed in the second interlayer insulating film 52, so as to coat the M1-connection plugs 10j and 10k, respectively. These patterns of the first interconnect layers M1 are formed in a rectangular shape having no bent portion, and the first interconnect layers M1a and M1b are spaced apart due to the layout of the lower layer.

Figure 16B:
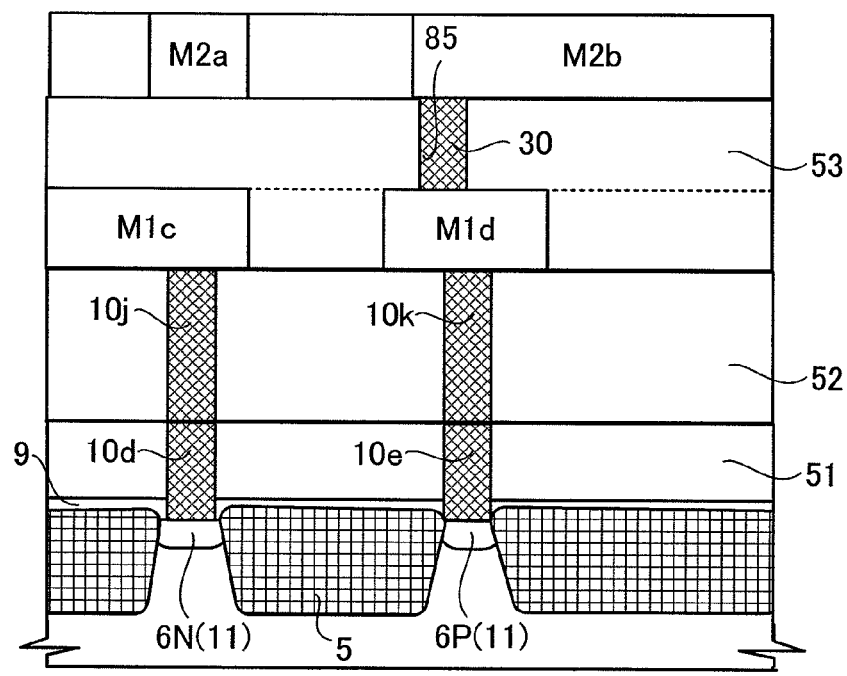
FIG. 16B is a sectional view taken along the line XVIB-XVIB of FIG. 16A.

The third interlayer insulating film 53 is formed on the first interconnect layers M1, and the M2-connection plug 30 is disposed in a connection hole 85 which is formed in the third interlayer insulating film 53 (see FIG. 16B). Further, the second interconnect layers M2 are formed so as to coat the M2-connection plug 30 which is exposed to the upper surface of the third interlayer insulating film 53 (see FIGS. 16A and 16B). In the example shown in FIG. 16B, a second interconnect layer M2b is formed on the M2-connection plug 30, and part of the second interconnect layer M2b is disposed so as to face the first interconnect layer M1d through the M2-connection plug 30. Additionally, at a position adjacent to the second interconnect layer M2b, another pattern of a second interconnect layer M2a is formed.

According to the fifth exemplary embodiment, the same effects as those of the first exemplary embodiment can be obtained by forming the intermediate connection layer 20. Moreover, the combination of the common connection plug and the intermediate connection layer 20 can effectively enhance the effect of increasing the degree of freedom of design for positioning the upper interconnect layer and the M1-connection plugs 10, without any limitations on the layout of the lower conductive layer.

Sixth Exemplary Embodiment

The basic structure of a semiconductor device according to a sixth exemplary embodiment of the present invention is similar to that of the second exemplary embodiment, except for the following. That is, in the semiconductor device according to the second exemplary embodiment, one M1-connection plug is connected to each of the upper surface and the lower surface of a single intermediate connection layer 20. Meanwhile, in the semiconductor device according to the sixth exemplary embodiment, two M1-connection plugs 10 are disposed below a single intermediate connection layer 20. As a result, the local interconnect function can be added to the intermediate connection layer 20.

Figure 17A:
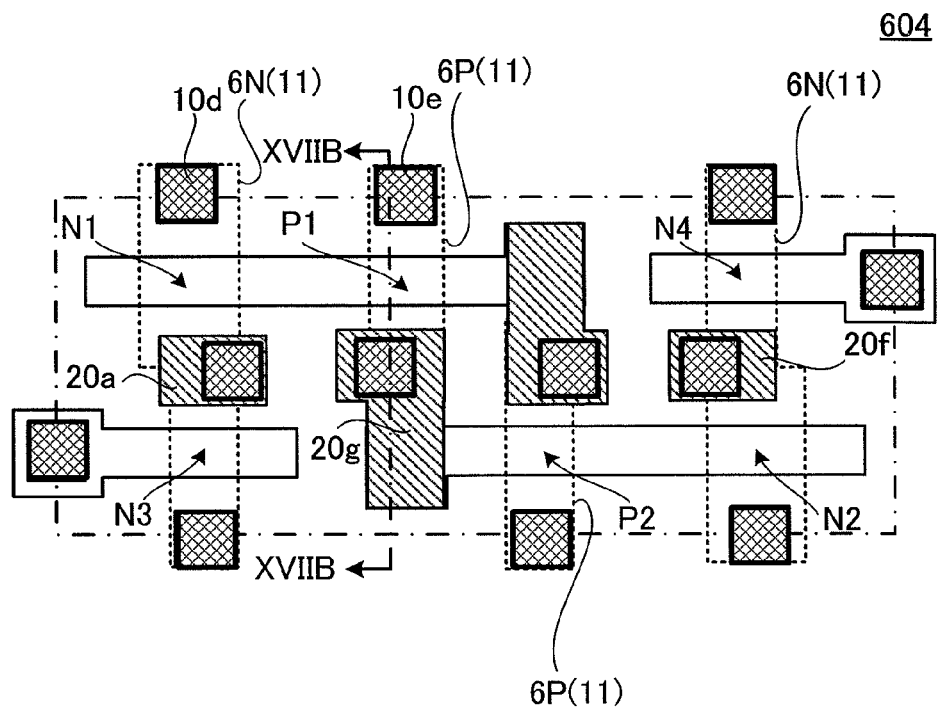
FIG. 17A is a top view showing a memory cell according to a sixth exemplary embodiment of the present invention.
Figure 17B:
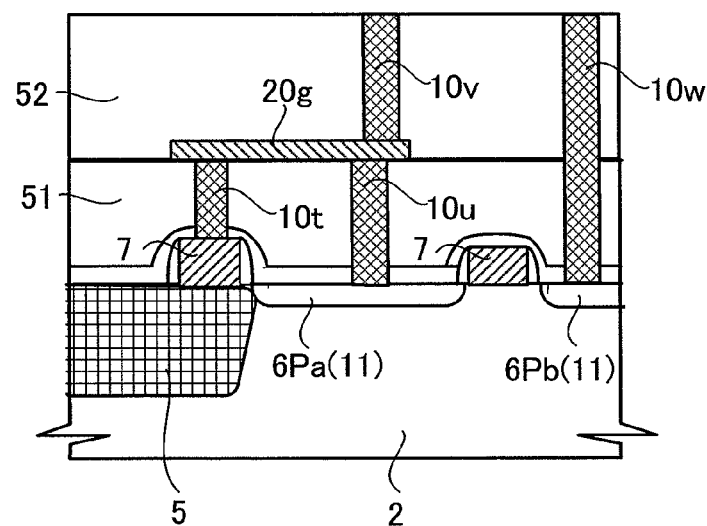
FIG. 17B is a sectional view taken along the line XVIIB-XVIIB of FIG. 17A.

FIG. 17A is a top view showing a memory cell 604 in a state where layers up to the second interlayer insulating film 52 and the M1-connection plugs 10, which are formed in the second interlayer insulating film 52, are formed. FIG. 17B is a sectional view taken along the line XVIIB-XVIIB of FIG. 17A.

As shown in FIG. 17B, an intermediate connection layer 20g is formed so as to coat two M1-connection plugs 10t and 10u which are formed in the first interlayer insulating film 51. An M1-connection plug 10v is formed on the intermediate connection layer 20g. In other words, as shown in FIG. 17B, an active region 6Pa and the first interconnect layer M1 (not shown) are connected together through the M1-connection plug 10u, the intermediate connection layer 20g, and the M1-connection plug 10v. Further, as shown in FIG. 17B, the gate electrode interconnect layer 7 and the first interconnect layer M1 (not shown) are connected together through the M1-connection plug 10t, the intermediate connection layer 20g, and the M1-connection plug 10v. Furthermore, an active region 6Pb is connected to the first interconnect layer M1 (not shown) through an M1-connection plug 10w.

According to the sixth exemplary embodiment, the same effects as those of the first exemplary embodiment can be obtained by forming the intermediate connection layer 20. Further, the local interconnect function for connecting the lower conductive layers 11 is added to the intermediate connection layer 20, thereby making it possible to increase the degree of freedom of design of the interconnect structure, without any limitations on the layout of the lower interconnect layer. The local interconnection according to the sixth exemplary embodiment is illustrated by way of example only, and intersecting lines of a flip-flop circuit may be formed by the intermediate connection layer, for example. While the sixth exemplary embodiment has been described as an example where the M1-connection plugs 10 to be connected to the first interconnect layer M1 are formed on the intermediate connection layer 20 which is a local interconnect layer, an intermediate connection layer having only the local interconnect function may be formed. The number of M1-connection plugs 10 to be connected to the intermediate connection layer is not particularly limited. Furthermore, a plurality of M1-connection plugs 10 may be disposed on the upper surface of the intermediate connection layer, and may be connected to the same or different first interconnect layer M1.

Seventh Exemplary Embodiment

Figure 18:
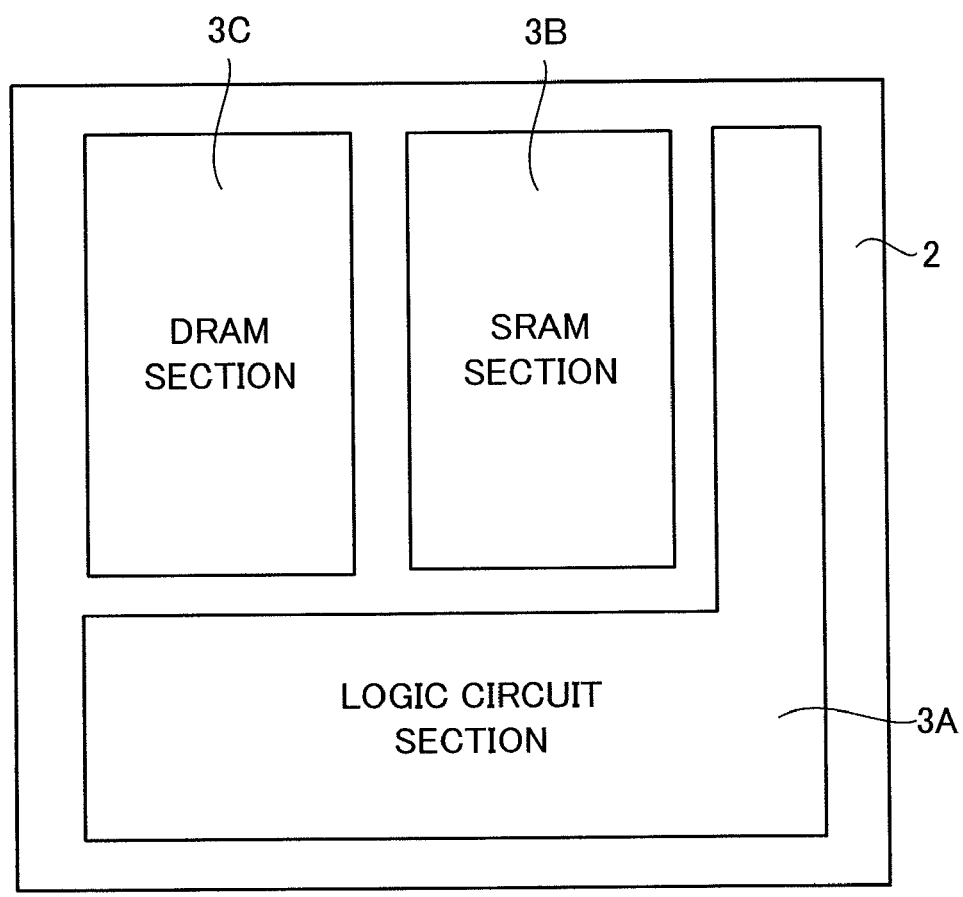
FIG. 18 is a block diagram showing a semiconductor device according to a seventh exemplary embodiment of the present invention.

Next, a description is given of an example of a semiconductor device 701 which is different from the first exemplary embodiment. FIG. 18 shows an example of a block diagram of a semiconductor device according to the seventh exemplary embodiment. As shown in FIG. 18, in the semiconductor device 701 according to the seventh exemplary embodiment, a logic circuit section 3A, an SRAM section 3B, and a DRAM (Dynamic Random Access Memory) section 3C are mixed. The SRAM section 3B and the DRAM section 3C are memory sections.

Figure 19:
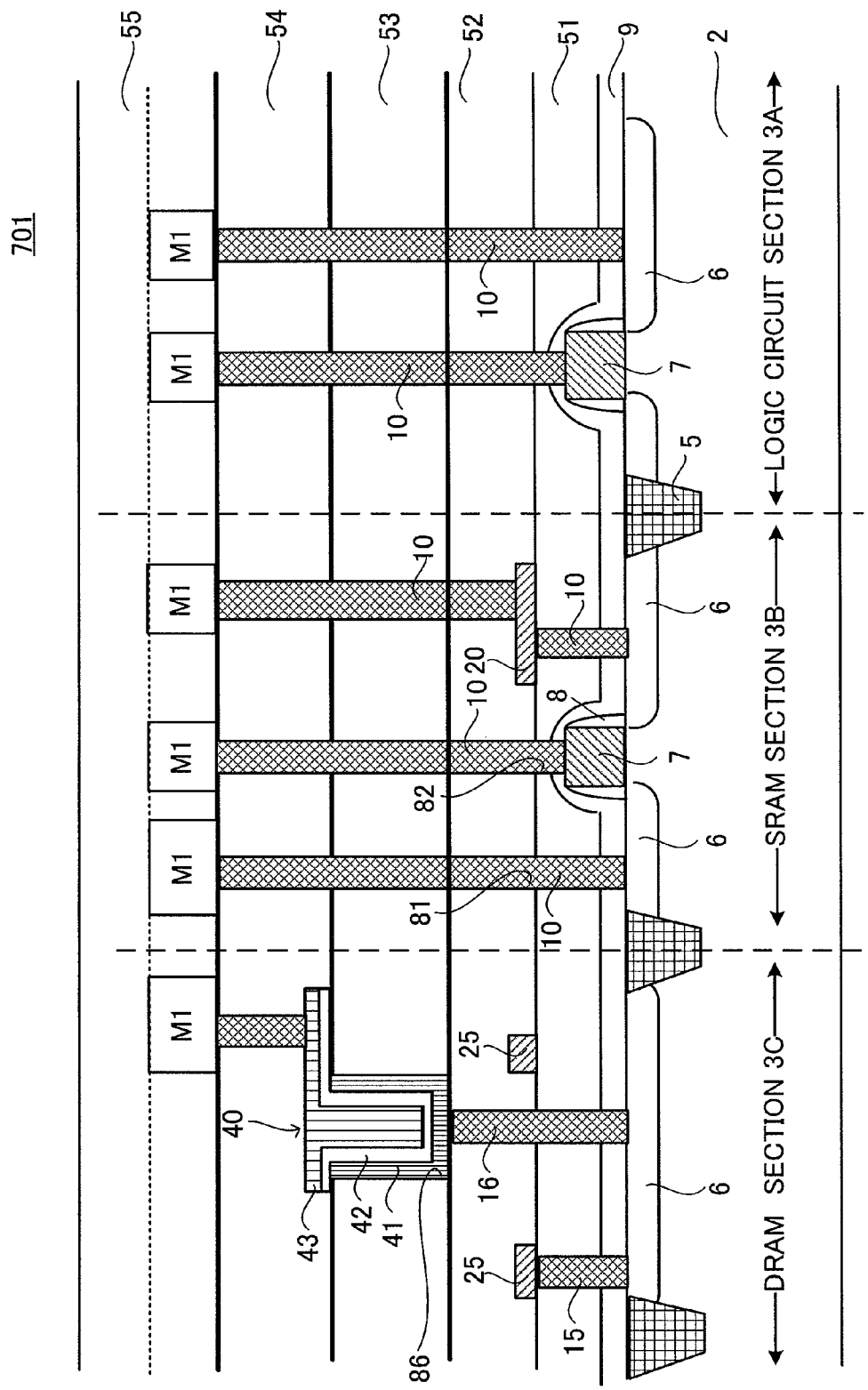
FIG. 19 is a partially enlarged sectional view schematically showing the semiconductor device according to the seventh exemplary embodiment.

FIG. 19 is a partially sectional view schematically showing the logic circuit section 3A, the SRAM section 3B, and the DRAM section 3C of the semiconductor device 701 according to the seventh exemplary embodiment. As shown in FIG. 19, the semiconductor device 701 includes a bit-line-connection plug 15, an MIM-connection plug 16, a bit line 25, an MIM (Metal-Insulator-Metal) capacitance 40, a fourth interlayer insulating film 54, and a fifth interlayer insulating film 55, in addition to the components of the first exemplary embodiment shown in FIG. 2A. The MIM capacitor 40 is formed in the DRAM section 3C, and includes a lower-layer metal 41, a capacitor insulating film 42, and an upper-layer metal 43. Note that, for convenience of explanation, illustration of the upper interconnect layer including the second interconnect layer M2 is omitted.

The intermediate connection layer 20 is formed on the first interlayer insulating film 51. As shown in FIG. 19, the first interconnect layers M1 are formed on the fourth interlayer insulating film 54. The bit line 25, which is formed by the same material and the same process as the intermediate connection layer 20, is disposed immediately above the first interlayer insulating film 51 of the DRAM section 3C. The bit line 25 is electrically connected to the active region 6 through the bit-line-connection plug 15. In the DRAM section 3C, a connection hole penetrating from the surface of the second interlayer insulating film 52 to the surface of the active region 6 is formed. The MIM-connection plug 16 is disposed in the connection hole.

The third interlayer insulating film 53 has an opening 86 for forming the MIM capacitor 40. The opening 86 reaches the surface of the second interlayer insulating film 52, and is formed so as to be overlapped with the position at which the MIM-connection plug 16 is formed. The lower-layer metal 41 of the MIM capacitor 40 is formed so as to coat a bottom portion and a side wall portion of the opening 86. The capacitor insulating film 42 is stacked so as to coat the upper layer of the lower-layer metal 41 and a portion of the surface of the third interlayer insulating film 53 in the vicinity of the opening 86. The upper-layer metal 43 is stacked so as to coat the capacitor insulating film 42.

The fourth interlayer insulating film 54 is formed so as to coat the MIM capacitor 40. Further, the first interconnect layers M1 are formed on the fourth interlayer insulating film 54. The first interconnect layers M1 and the lower conductive layer (e.g., the active regions 6 and the gate electrode interconnect layers 7) are connected to each other through the M1-connection plugs 10 which are disposed in the connection holes formed in each interlayer insulating film. In a similar manner as in the first exemplary embodiment, in the logic circuit section 3A, the lower conductive layer 11 and the M1-connection plugs 10 are connected to each other through the M1-connection plugs 10 which are formed immediately above positions so as to extend from immediately above the lower conductive layer 11, without involving the intermediate connection layer 20. As in the third exemplary embodiment, the intermediate connection layer 20 may be formed at a position where the M1-connection plugs are in contact with each other between the interlayer insulating films.

In the seventh exemplary embodiment, a description has been given of an example where the intermediate connection layer 20 is formed between the first interlayer insulating film 51 and the second interlayer insulating film 52. Alternatively, the intermediate connection layer 20 may be formed between the second interlayer insulating film 52 and the third interlayer insulating film 53, or between the third interlayer insulating film 53 and the fourth interlayer insulating film 54, for example. Although the description has been given of the case where the first interconnect layers M1 are formed at positions in the upper layer of the fourth interlayer insulating film 54, this is merely an example and the first interconnect layers M1 may be formed in the third interlayer insulating film or in the upper layer of the fourth interlayer insulating film 54. Further, the intermediate connection layer 20 may be formed of multiple layers. For example, the intermediate connection layer 20 may be formed between the first interlayer insulating film 51 and the second interlayer insulating film 52, or between the third interlayer insulating film 53 and the fourth interlayer insulating film 54. In this case, the upper-layer metal 43 of the MIM capacitor 40 may be formed by the same material and the same process as the intermediate connection layer.

According to the seventh exemplary embodiment, the same effects as those of the first exemplary embodiment can be obtained by forming the intermediate connection layer 20. Moreover, in the case of forming the DRAM section 3C, the intermediate connection layer 20 may be shared by the bit line 25, the upper-layer metal 43 of the MIM capacitor 40, or the like. As a result, the efficiency of the manufacturing process can be enhanced. Note that the bit line 25 is illustrative only, and a word line may be formed at the position of the bit line 25 and may be shared by the intermediate connection layer.

Eighth Exemplary Embodiment

In the semiconductor device according to the eighth exemplary embodiment, the first interconnect layers M1 are formed on the third interlayer insulating film 53. Additionally, in the eighth exemplary embodiment, an MIM capacitor 840 is formed on the second interlayer insulating film 52.

Figure 20A:
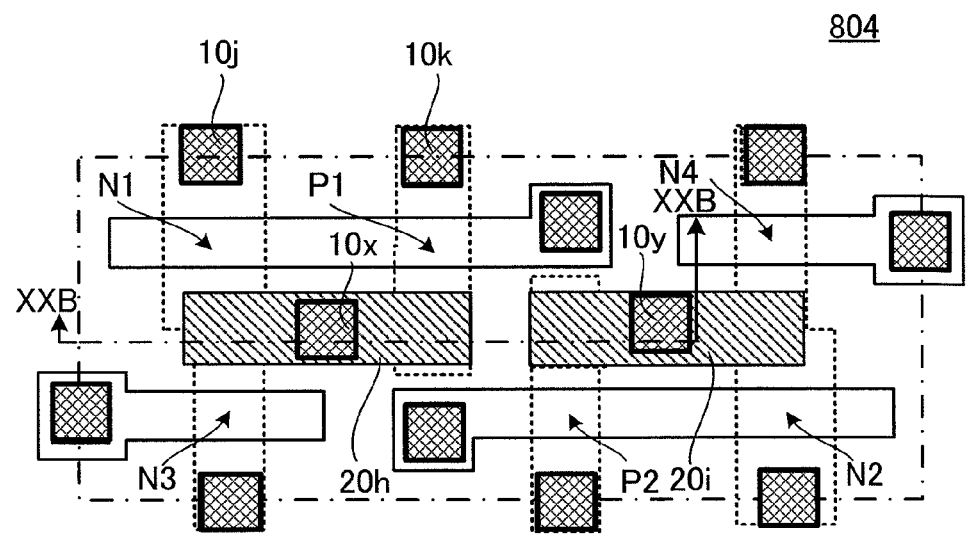
FIG. 20A is a top view showing a memory cell according to an eighth exemplary embodiment of the present invention.
Figure 20B:
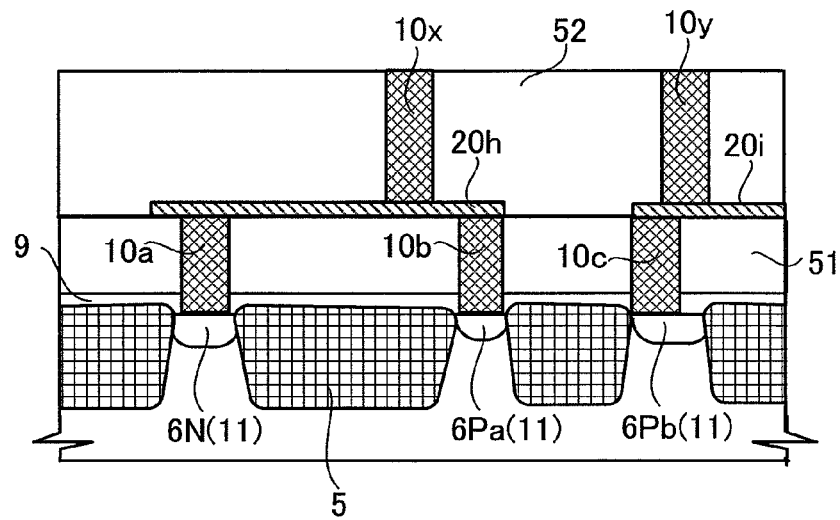
FIG. 20B is a sectional view taken along the line XXB-XXB of FIG. 20A.
Figure 21:
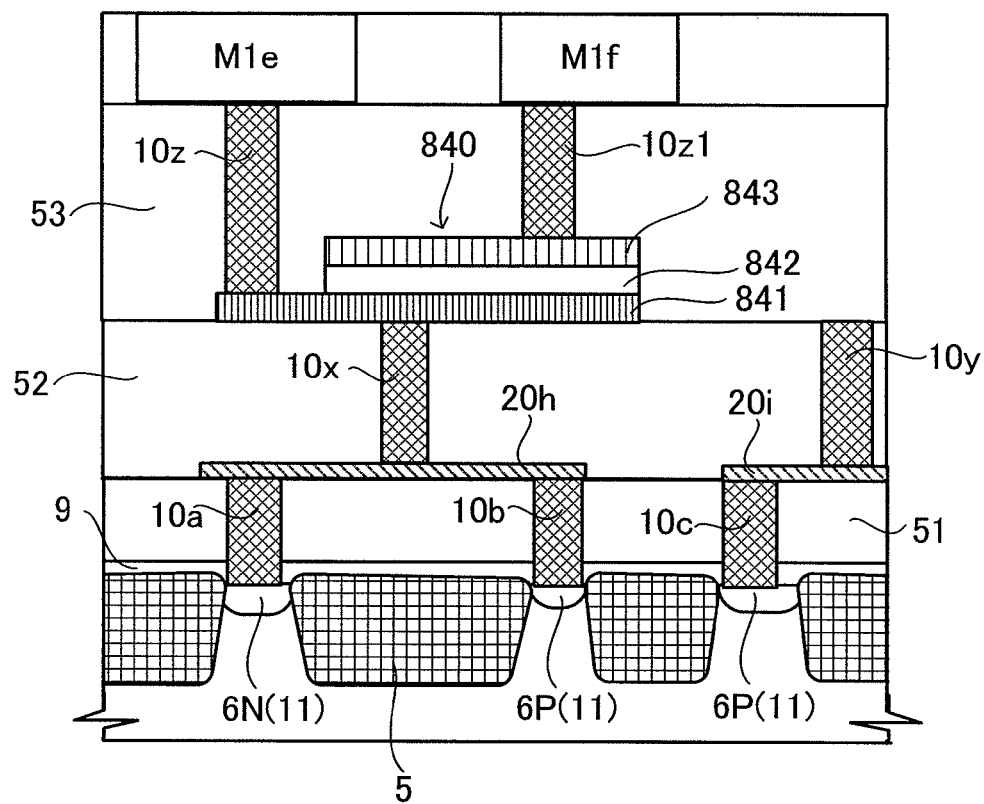
FIG. 21 is a sectional view showing the memory cell according to the eighth exemplary embodiment.

FIG. 20A is a top view showing a memory cell 804 in a state where the second interlayer insulating film 52 and the M1-connection plugs 10 which are formed in the second interlayer insulating film 52 are formed. FIG. 20B is a sectional view taken along the line XXB-XXB of FIG. 20A. FIG. 21 is a sectional view showing a state where the MIM capacitor 840, the third interlayer insulating film 53, the M1-connection plugs 10, and the first interconnect layers M1 are further formed in the upper layer shown in FIG. 20B.

As shown in FIG. 20B, an intermediate connection layer 20h is formed on the two M1-connection plugs 10a and 10b which are formed in the first interlayer insulating film 51. An M1-connection plug 10x is formed on the intermediate connection layer 20h. In other words, as shown in FIG. 20B, the active region 6Pa and the first interconnect layer M1 (not shown) are connected together through the M1-connection plug 10b, the intermediate connection layer 20h, and the M1-connection plug 10x. Further, as shown in FIG. 20B, the active region 6N and the first interconnect layer M1 (not shown) are connected together through the M1-connection plug 10a, the intermediate connection layer 20h, and the M1-connection plug 10x. Furthermore, the active region 6Pb and the first interconnect layer M1 (not shown) are connected together through the M1-connection plug 10c, an intermediate connection layer 20i, and an M1-connection plug 10y.

The MIM capacitor 840 is formed on the second interlayer insulating film 52. The MIM capacitor 840 includes a lower-layer metal 841, a capacitor insulating film 842, and an upper-layer metal 843. Further, an M1-connection plug 10z is disposed in a connection hole penetrating from the surface of the third interlayer insulating film 53 to the surface of the lower-layer metal 841. Furthermore, an M1-connection plug 10z1 is disposed in a connection hole penetrating from the surface of the third interlayer insulating film 53 to the surface of the upper-layer metal 843. A first interconnect layer M1e is formed on the M1-connection plug 10z which is exposed to the surface of the third interlayer insulating film 53. A first interconnect layer M1f is formed on the M1-connection plug 10z1 which is exposed to the surface of the third interlayer insulating film 53.

According to the eighth exemplary embodiment, the same effects as those of the first exemplary embodiment can be obtained by forming the intermediate connection layer 20. Moreover, the local interconnect function for connecting the lower conductive layers is added to the intermediate connection layer 20, thereby making it possible to increase the degree of freedom of design of the interconnect structure, without any limitations on the layout of the lower interconnect layer. For example, the degree of freedom of arrangement positions of the M1-connection plugs 10 is increased by applying the intermediate connection layer 20. As a result, functional elements such as the MIM capacitor can be mounted, for example, so as to improve the SER (Soft Error Rates) resistance while maintaining the layout of the lower conductive layer 11.

Ninth Exemplary Embodiment

Figure 22:
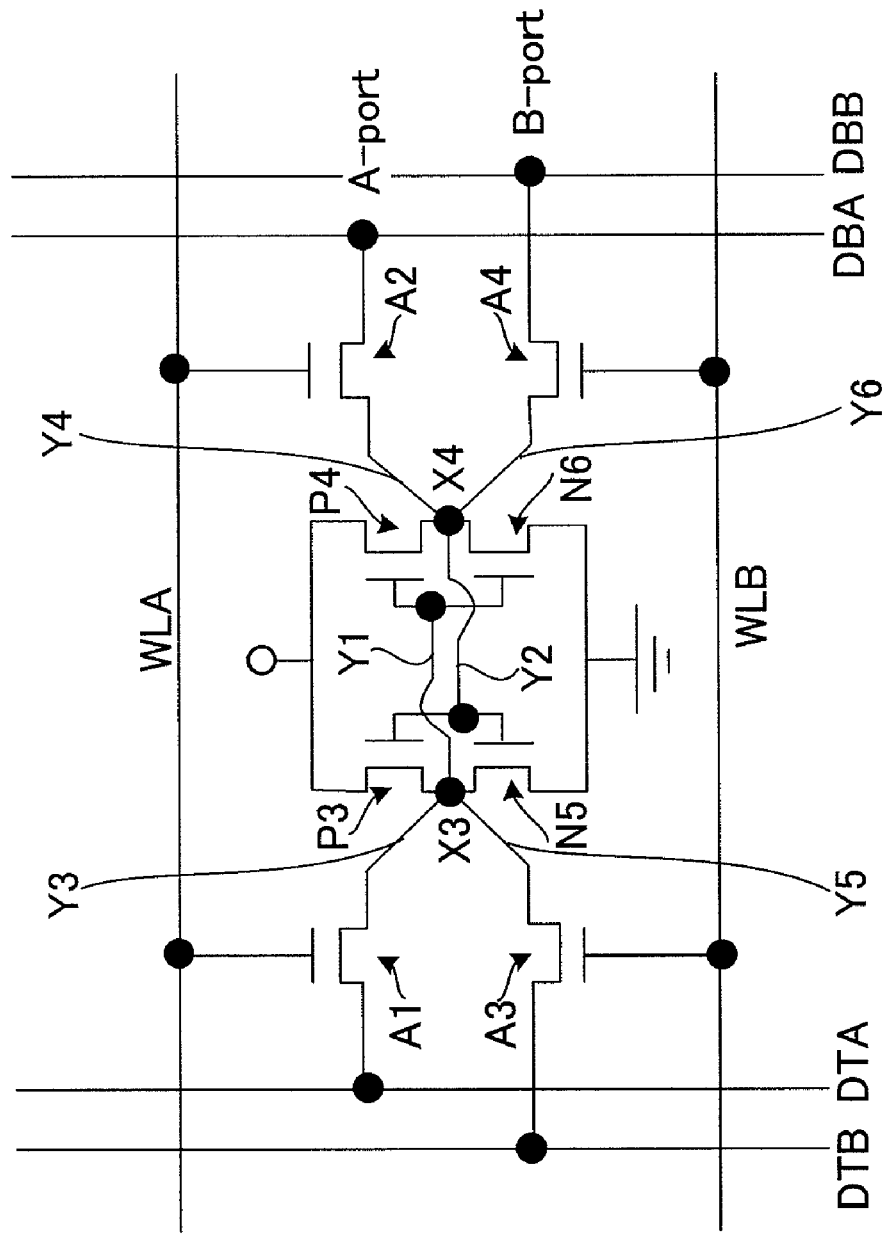
FIG. 22 is an equivalent circuit diagram showing a memory cell of a dual-port SRAM.

Next, a description is given of an example where an intermediate connection layer is applied to a memory cell of a CMOS dual-port SRAM. FIG. 22 is an equivalent circuit diagram showing a memory cell of the CMOS dual-port SRAM. A memory cell 904 of the SRAM includes eight transistors: two p-channel MOS transistors P3 and P4 and six n-channel MOS transistors N5, N6, and A1 to A4. Unlike the single-port SRAM cell described above, the memory cell 904 has two ports for inputting and outputting data. An A-port is composed of the transistors A1 and A2, and a B-port is composed of the transistors A3 and A4. The A-port composed of the transistors A1 and A2 is connected with a pair of bit lines DBA and DTA and a word line WLA. The B-port composed of the transistors A3 and A4 is connected with a pair of bit lines DBB and DTB and a word line WLB. Note that the transistors P3 and P4 each function as a load transistor, like the transistors P1 and P2. The transistors N5 and N6 each function as a drive transistor.

Figure 23:
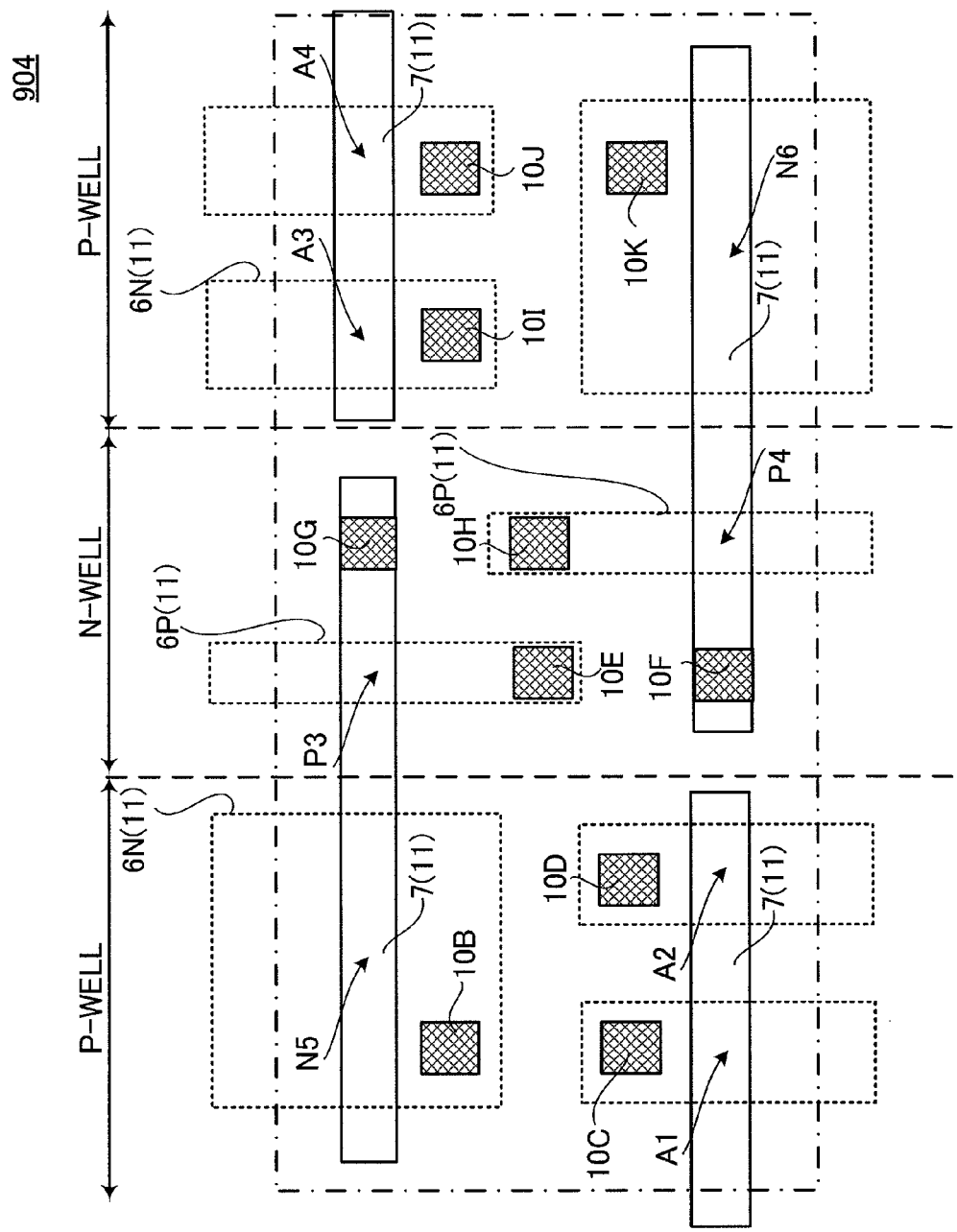
FIG. 23 is a top view showing a memory cell according to a ninth exemplary embodiment of the present invention.

FIG. 23 is a top view showing a base layer including the active regions 6, which are formed on the surface of the semiconductor substrate 2, the lower conductive layer 11 such as the gate electrode interconnect layers 7, and the M1-connection plugs 10. As shown in FIG. 23, an n-well region in which the p-channel MOS transistors P3 and P4 are formed is located in a central area, and a p-well region in which the n-channel MOS transistors N5, A1, and A2 are formed and a p-well region in which the n-channel MOS transistors N6, A3, and A4 are formed are located on both sides of the n-well region.

The eight transistors constituting the memory cell 904 are manufactured by using materials and a manufacturing method similar to those of the first exemplary embodiment, for example. As shown in FIG. 23, M1-connection plugs 10B to 10K are disposed in connection holes penetrating from the surface of the first interlayer insulating film 51 (not shown) (see FIG. 3A) to the surface of the active regions 6N and 6P or to the surface of the gate electrode interconnect layers 7.

Figure 24:
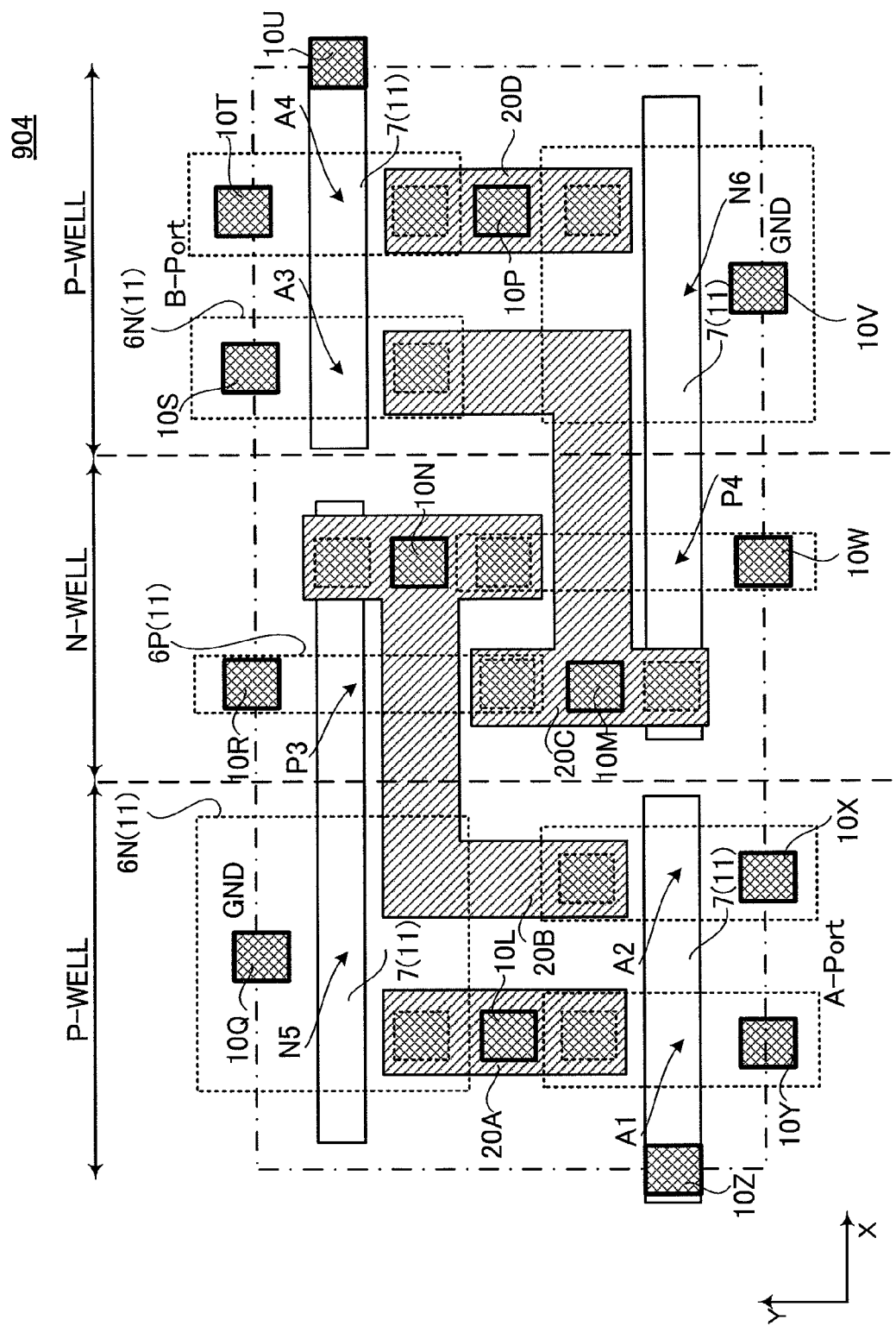
FIG. 24 is a top view showing the memory cell according to the ninth exemplary embodiment.

FIG. 24 is a top view showing a state where intermediate connection layers 20A to 20D and the M1-connection plugs 10 formed thereon are further formed in the structure shown in FIG. 23. The intermediate connection layer 20A extends in the Y-direction of FIG. 24 so as to coat the M1-connection plugs 10B and 10C which are exposed to the surface of the first interlayer insulating film 51 (not shown). The intermediate connection layer 20B is formed so as to coat the M1-connection plugs 10D, 10G, and 10H. Specifically, the intermediate connection layer 20B includes a region extending in the Y-direction of FIG. 24 so as to coat the M1-connection plugs 10G and 10H, a region extending in the Y-direction so as to coat the M1-connection plug 10D, and a region extending in the X-direction from the vicinity of a central portion between the M1-connection plugs 10G and 10H so as to connect these regions.

The intermediate connection layer 20C is formed so as to coat the M1-connection plugs 10E, 10F, and 10I. Specifically, the intermediate connection layer 20C includes a region extending in the Y-direction so as to coat the M1-connection plugs 10E and 10F, a region extending in the Y-direction so as to coat the M1-connection plug 10I, and a region extending in the X-direction from the vicinity of a central portion between the M1-connection plugs 10E and 10F so as to connect these regions. The intermediate connection layer 20D extends in the Y-direction so as to coat the M1-connection plugs 10J and 10K.

The intermediate connection layer 20B forms a connection line Y4 between an intersecting line Y2 of the flip-flop circuit and the transistor A2 shown in FIG. 22. Likewise, the intermediate connection layer 20C forms a connection line Y5 between an intersecting line Y1 of the flip-flop and the transistor A3 shown in FIG. 22. The intermediate connection layer 20A forms a connection line Y3 between the transistor A1 and the transistor N5 shown in FIG. 22, and the intermediate connection layer 20D forms a connection line Y6 between the transistor A4 and the transistor N6.

On the intermediate connection layers 20A to 20D, the M1-connection plugs 10 to be connected to the first interconnect layers M1 are formed in the second interlayer insulating film 52 (not shown) (see FIG. 2A). Specifically, an M1-connection plug 10L is disposed in substantially the central area of the upper layer of the intermediate connection layer 20A, and an M1-connection plug 10N is disposed in the upper layer in substantially the central area between the M1-connection plugs 10G and 10H of the intermediate connection layer 20B. Likewise, an M1-connection plug 10M is disposed in the upper layer in substantially the central area between the M1-connection plugs 10E and 10F of the intermediate connection layer 20C, and an M1-connection plug 10P is disposed in substantially the central area in the upper layer of the intermediate connection layer 20D.

Further, at a boundary portion of the memory cell 904, M1-connection plugs 10Q to 10Z are disposed in connection holes penetrating from the surface of the second interlayer insulating film 52 (not shown) to the active regions 6 or to the surface of the gate electrode interconnect layers 7. The M1-connection plugs 10Q and 10V are each connected to a GND. The M1-connection plugs 10Q to 10Z are formed without involving the intermediate connection layer 20. In the ninth exemplary embodiment, connection holes penetrating from the surface of the second interlayer insulating film 52 to the lower conductive layer 11 which is formed below the first interlayer insulating film 51 are collectively formed, and the M1-connection plugs 10 are disposed in the connection holes.

Figure 25:
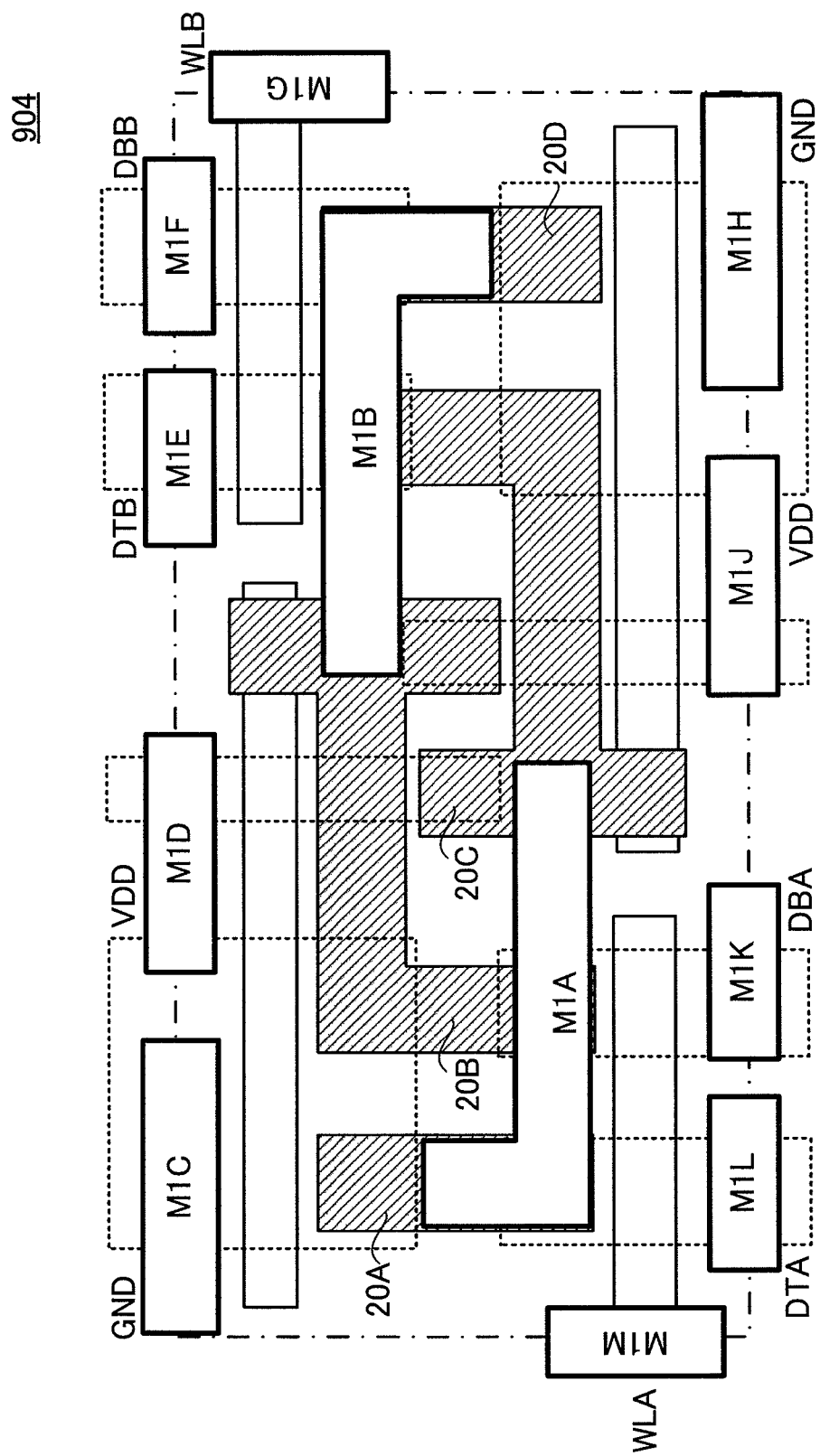
FIG. 25 is a top view showing the memory cell according to the ninth exemplary embodiment.

FIG. 25 is a top view showing a state where the first interconnect layers M1 are further formed in the structure shown in FIG. 24. On the second interlayer insulating film 52 (see FIG. 2), first interconnect layers M1A to M1M to be connected to the M1-connection plugs 10 are formed. Specifically, the first interconnect layer M1A has an L-shaped pattern which is formed so as to connect the M1-connection plugs 10L and 10M. Thus, the intermediate connection layers 20A and 20C are connected to each other. In other words, the first interconnect layer M1A functions as a connection node X3 shown in FIG. 22. Likewise, the first interconnect layer M1B has an L-shaped pattern which is formed so as to connect the M1-connection plugs 10N and 10P. Thus, the intermediate connection layers 20B and 20D are connected to each other. In other words, the first interconnect layer M1B functions as a connection node X4 shown in FIG. 22.

Further, the first interconnect layers M1C and M1H are connected to the M1-connection plugs 10Q and 10V, respectively, and are also connected to the GND. The first interconnect layers M1D and M1J are connected to the M1-connection plugs 10R and 10W, respectively, are also connected to a VDD power supply. The first interconnect layer M1E is connected to the M1-connection plug 10S, and is also connected to the bit line DTB in the upper layer. Likewise, the first interconnect layer M1F is connected to the M1-connection plug 10T, and is also connected to the bit line DBB in the upper layer. The first interconnect layer M1K is connected to the M1-connection plug 10X, and is also connected to the bit line DBA in the upper layer. The first interconnect layer M1L is connected to the M1-connection plug 10Y, and is connected to the bit line DTA in the upper layer. The first interconnect layer M1G is connected to the M1-connection plug 10U, and is also connected to the word line WLB in the upper layer. Likewise, the first interconnect layer M1M is connected to the M1-connection plug 10Z, and is also connected to the word line WLA in the upper layer.

Figure 26:
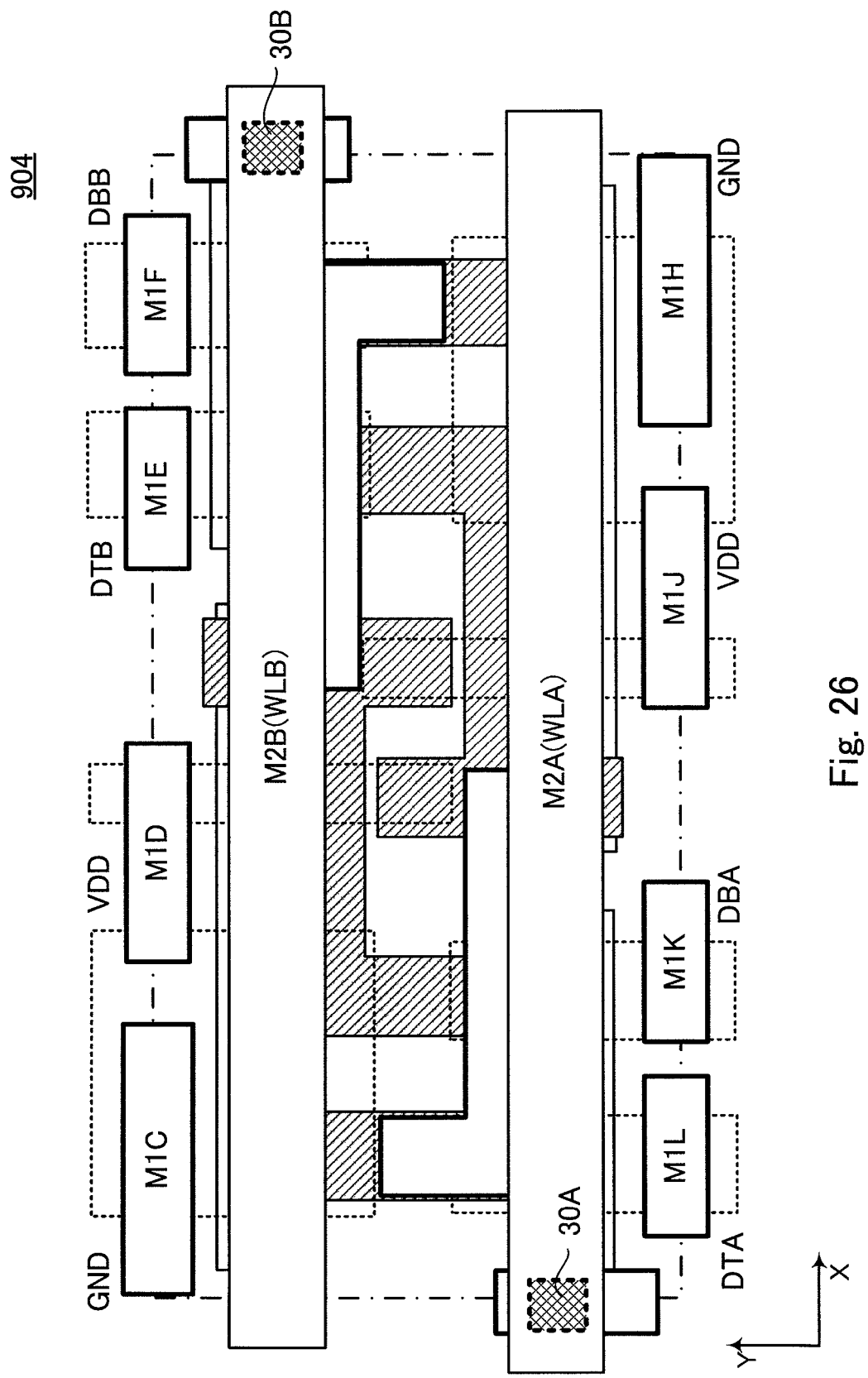
FIG. 26 is a top view showing the memory cell according to the ninth exemplary embodiment.

FIG. 26 is a top view showing a state where the second interconnect layers M2 are further formed in the structure shown in FIG. 25. An M2-connection plug 30A is disposed on the first interconnect layers M1. A second interconnect layer M2A which extends in the X-direction of FIG. 26 is formed on the M2-connection plug 30A. The second interconnect layer M2A functions as the word line WLA. Likewise, an M2-connection plug 30B is disposed on the first interconnect layer M1G. A second interconnect layer M2B which extends in the X-direction is formed on the M2-connection plug 30B. The second interconnect layer M2B functions as the word line WLB.

According to the ninth exemplary embodiment, the same effects as those of the first exemplary embodiment can be obtained by forming the intermediate connection layer 20. Further, the intersecting lines Y1 and Y2 having a bent shape are formed by the intermediate connection layer having a thickness smaller than that of the first interconnect layer M1, thereby making it possible to increase the production margin for lithography or the like. Furthermore, the use of the intermediate connection layer 20 makes it possible to complete the interconnection within the cell with the first interconnect layers M1 and lower interconnect layers. Accordingly, as compared to the case of forming the cell using the first interconnect layers M1 and the second interconnect layers M2, intra-cell lines which are formed between the word lines can be omitted, which results in a reduction in noise and coupling failure.

Tenth Exemplary Embodiment

Next, a description is given of an example where an intermediate connection layer is applied to a memory cell of a CMOS dual-port SRAM having a structure different from that of the ninth exemplary embodiment. The memory cell of the SRAM according to the tenth exemplary embodiment has a form extending in the lateral direction, with the interval between gates being reduced.

Figure 27:
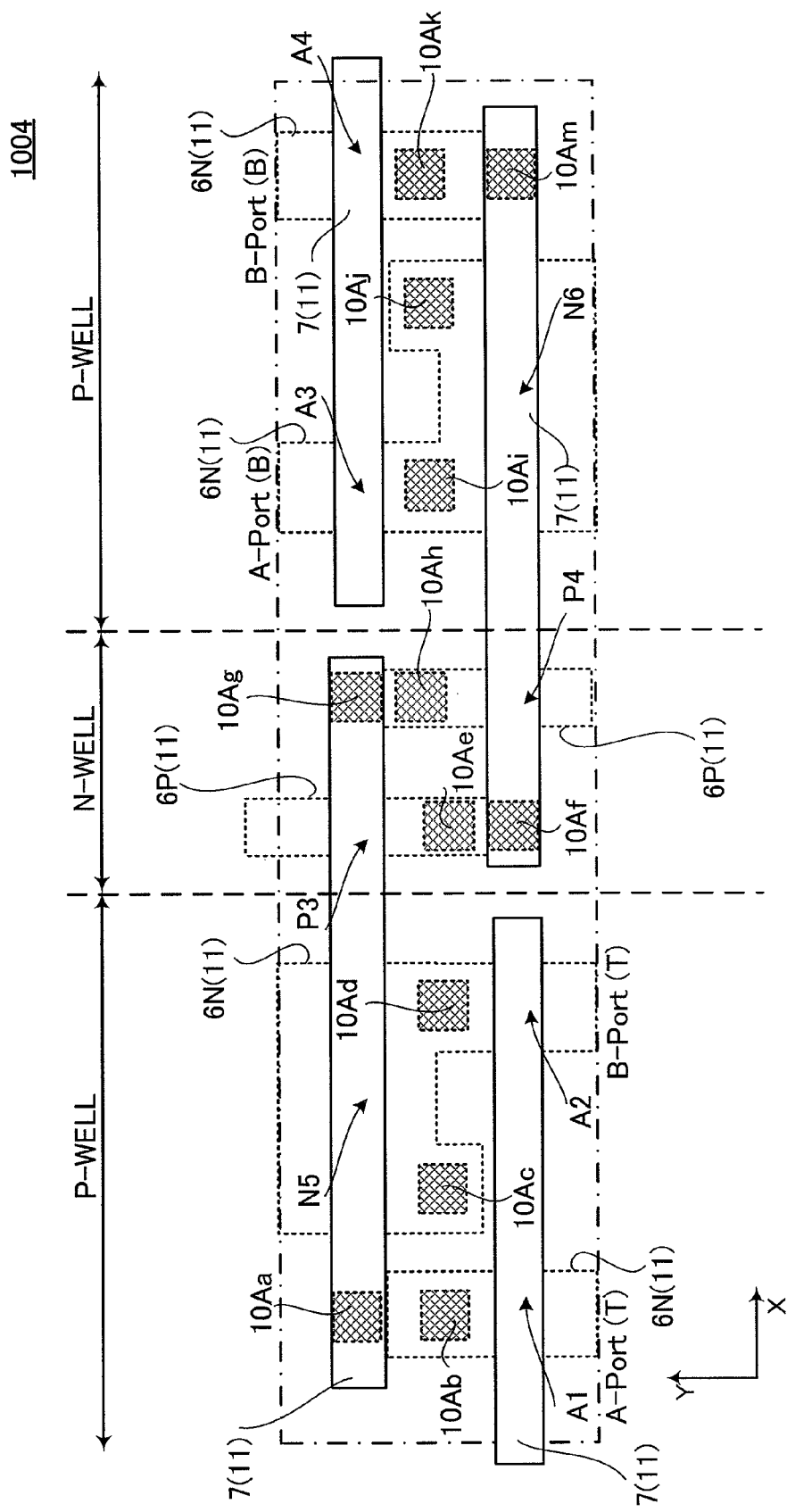
FIG. 27 is a top view showing a memory cell according to a tenth exemplary embodiment of the present invention.

FIG. 27 is a top view showing a state where the active regions 6 formed on the surface of the semiconductor substrate 2, the lower conductive layer 11 such as the gate electrode interconnect layers 7, and the M1-connection plugs 10 are formed. As shown in FIG. 27, a memory cell 1004 includes an n-well region in which the p-channel MOS transistors P3 and P4 are formed is located in a central area, and a p-well region in which the n-channel MOS transistors N5, A1, and A2 are formed and a p-well region in which the n-channel MOS transistors N6, A3, and A4 are formed are located on both sides of the n-well region.

As shown in FIG. 27, M1-connection plugs 10Aa to 10Am are formed on the lower conductive layer 11. The M1-connection plugs 10Aa to 10Am are disposed in connection holes penetrating from the surface of the first interlayer insulating film 51 (not shown) (see FIG. 3A) to the surface of the active regions 6N and 6P or to the surface of the gate electrode interconnect layers 7. Since the memory cell 1004 of the SRAM according to the tenth exemplary embodiment has a form extending in the lateral direction, two M1-connection plugs 10 are formed in the active regions so as to reduce a diffusion layer resistance (active region resistance) of the transistor N6. Note that the number of M1-connection plugs 10 to be connected to the active regions is not particularly limited.

Figure 28:
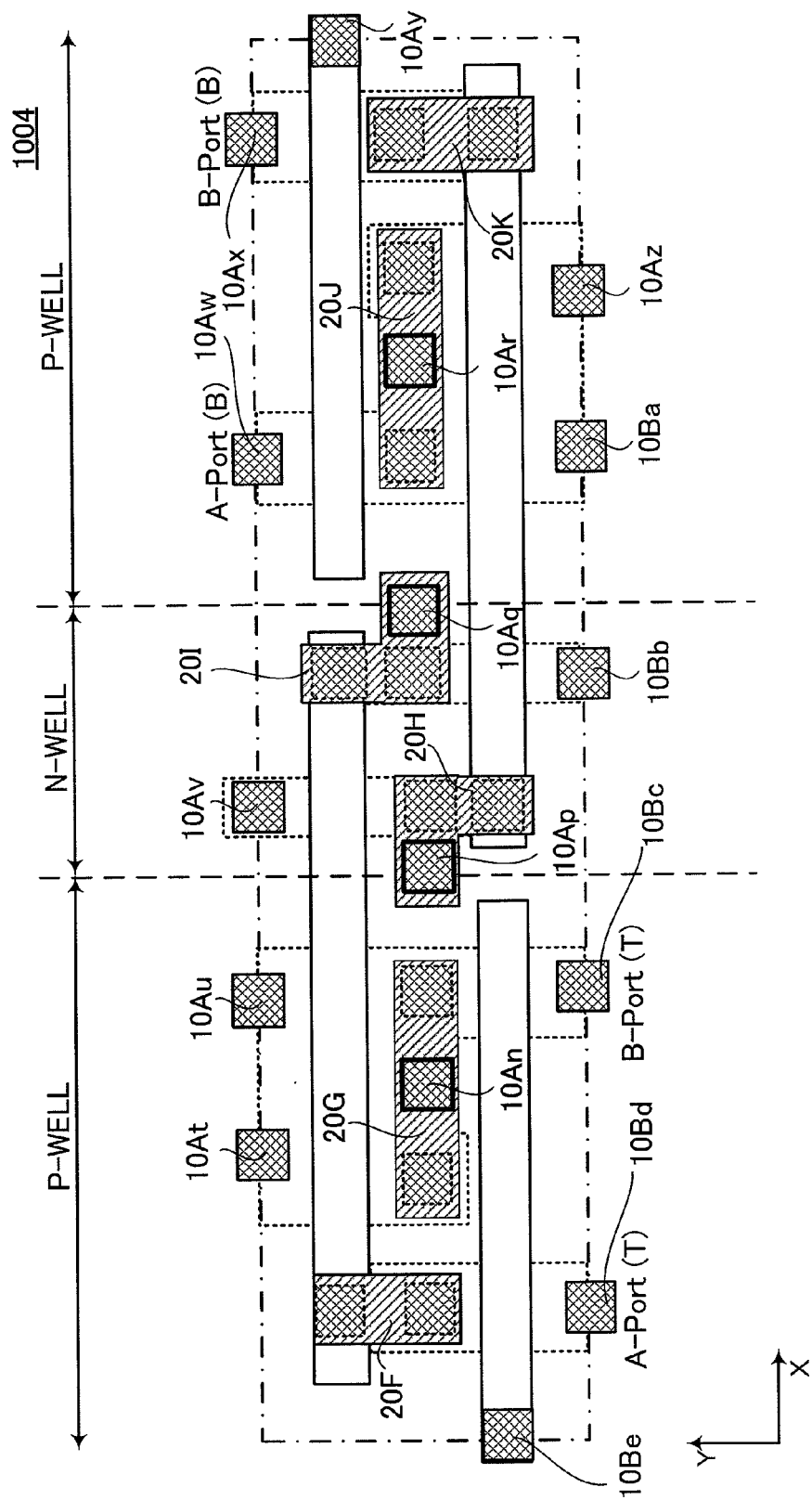
FIG. 28 is a top view showing the memory cell according to the tenth exemplary embodiment.

FIG. 28 is a top view showing a state where intermediate connection layers 20F to 20K and the M1-connection plugs 10 which are formed thereon are further formed in the structure shown in FIG. 27. The intermediate connection layer 20F extends in the Y-direction of FIG. 28 so as to coat the M1-connection plugs 10Aa and 10Ab which are exposed to the surface of the first interlayer insulating film 51 (not shown). The intermediate connection layer 20G extends in the X-direction of FIG. 28 so as to coat the M1-connection plugs 10Ac and 10Ad. The intermediate connection layer 20H extends in the Y-direction so as to coat the M1-connection plugs 10Ae and 10Af, and extends in the X-direction on the left side of FIG. 28 from the position where the M1-connection plug 10Ae is disposed. In other words, the intermediate connection layer 20H has such a shape that the "L" shape of FIG. 28 is inverted with respect to the X-direction and Y-direction. Likewise, the intermediate connection layer 20I extends in the Y-direction so as to coat the M1-connection plugs 10Ag and 10Ah, and extends in the X-direction on the right side of FIG. 28 from the position where the M1-connection plug 10Ah is disposed. In other words, the intermediate connection layer 20I has an "L" shape in FIG. 28. The intermediate connection layer 20J extends in the X-direction so as to coat the M1-connection plugs 10Ai and 10Aj. The intermediate connection layer 20K extends in the Y-direction so as to coat the M1-connection plugs 10Ak and 10Am.

On the intermediate connection layers 20G, 20H, 20I, and 20J, the M1-connection plugs 10 to be connected to the first interconnect layers M1 are disposed in the second interlayer insulating film 52 (not shown) (see FIG. 2A). Specifically, an M1-connection plug 10An is disposed in substantially the central area in the upper layer of the intermediate connection layer 20G, and an M1-connection plug 10Ar is disposed in substantially the central area in the upper layer of the intermediate connection layer 20J. Further, in the upper layer of the intermediate connection layer 20H, an M1-connection plug 10Ap is disposed in a region extending in the X-direction on the left side of FIG. 28 from the position of the M1-connection plug 10Ae. Likewise, in the upper layer of the intermediate connection layer 20I, an M1-connection plug 10Aq is disposed in a region extending in the X-direction on the right side of FIG. 28 from the position of the M1-connection plug 10Ah.

Meanwhile, the M1-connection plugs 10 to be connected to the first interconnect layers M1 are not disposed on the intermediate connection layers 20F and 20K. In other words, the intermediate connection layers 20F and 20K have the local interconnect function exclusively used for connection with the lower conductive layer 11.

Further, at a boundary portion of the memory cell 1004, M1-connection plugs 10At to 10Be are disposed in connection holes penetrating from the surface of the second interlayer insulating film 52 (not shown) to the active regions 6 or to the surface of the gate electrode interconnect layers 7. The M1-connection plugs 10At to 10Be are formed without involving the intermediate connection layer 20. In the tenth exemplary embodiment, connection holes penetrating from the surface of the second interlayer insulating film 52 to the lower conductive layer 11 which is formed below the first interlayer insulating film 51 are collectively formed, and the M1-connection plugs 10 are disposed in the connection holes.

Figure 29:
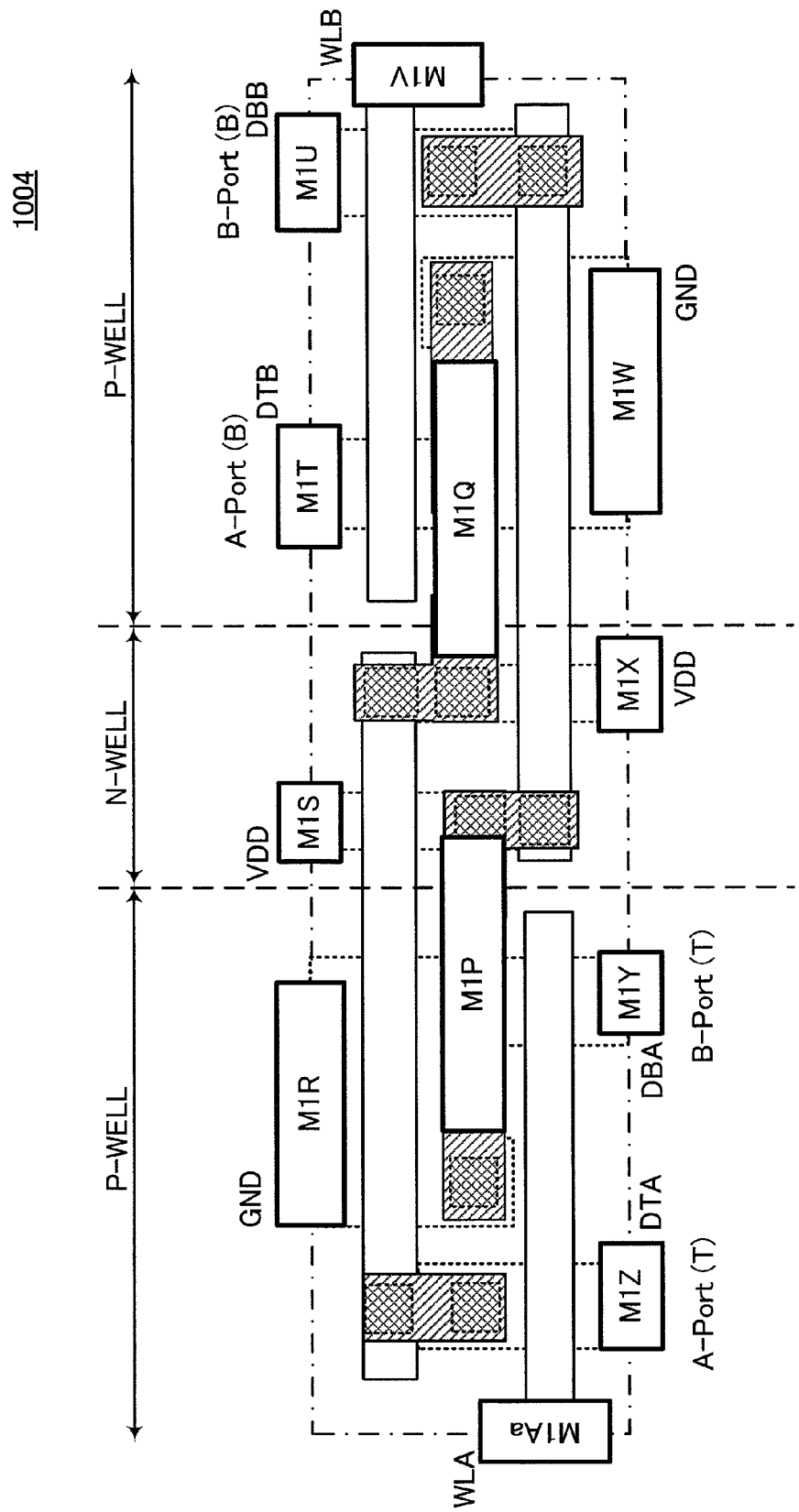
FIG. 29 is a top view showing the memory cell according to the tenth exemplary embodiment.
Figure 30:
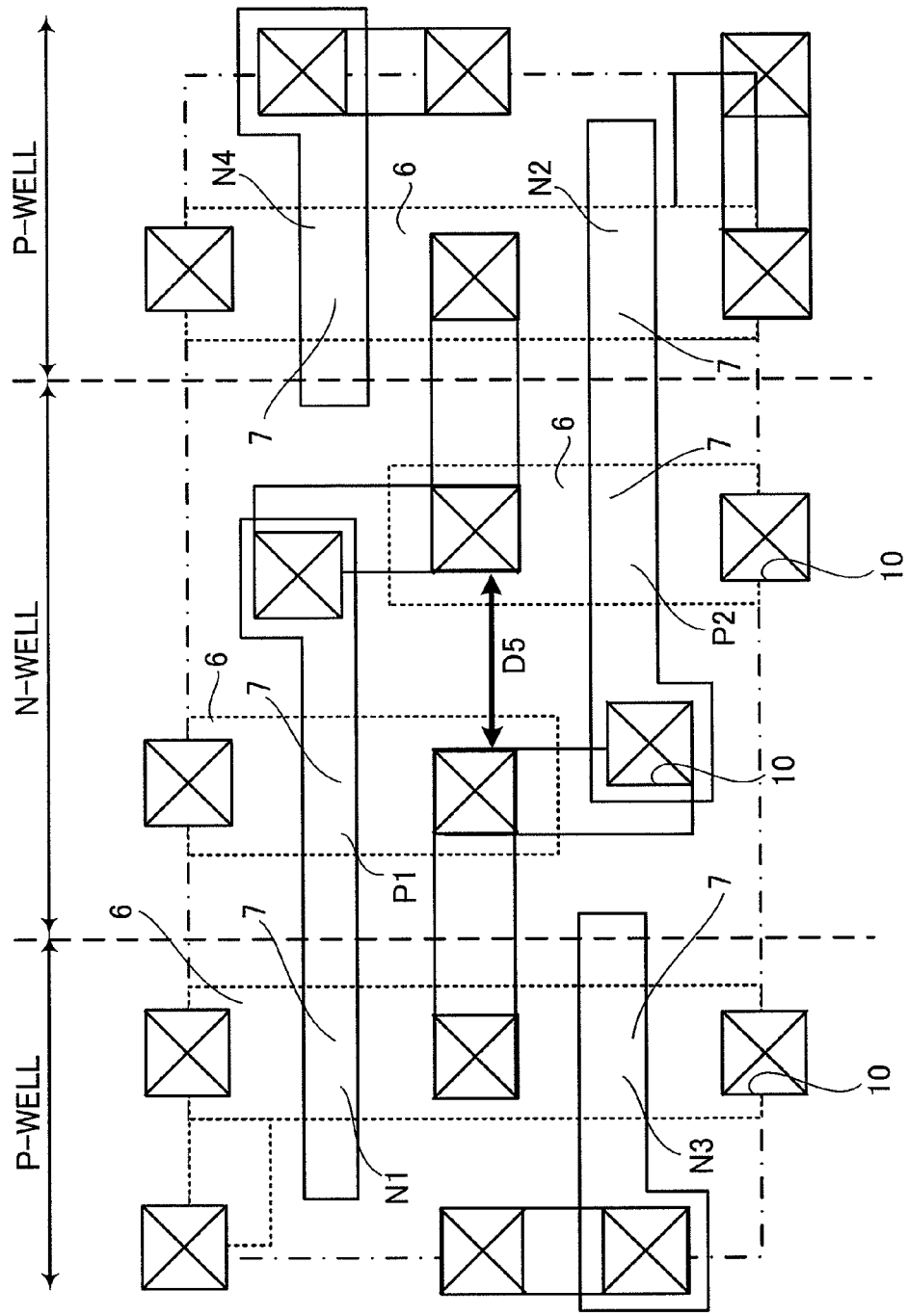
FIG. 30 is a top view showing a memory cell disclosed in Patent Document 1.
Figure 31:
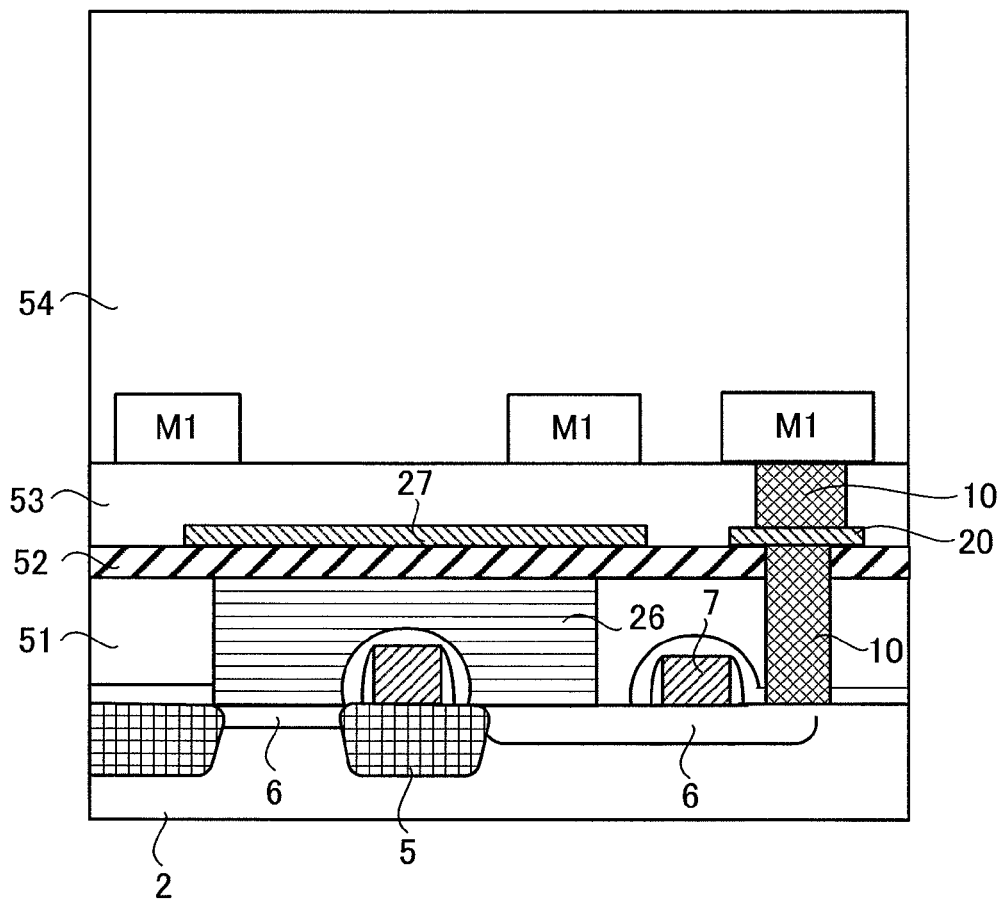
FIG. 31 is a sectional view showing a memory cell disclosed in Patent Document 2.

FIG. 29 is a top view showing a state where the first interconnect layers M1 are further formed in the structure shown in FIG. 28. On the second interlayer insulating film 52 (not shown) (see FIG. 2A), first interconnect layers M1P to M1Aa to be connected to the M1-connection plugs 10 are formed. Specifically, the first interconnect layer M1P extends in the X-direction so as to connect the M1-connection plugs 10An and 10Ap. Thus, the intermediate connection layers 20G and 20H are connected to each other. In other words, the first interconnect layer M1P functions as the connection node X4 shown in FIG. 22. Likewise, the first interconnect layer M1Q extends in the X-direction so as to connect the M1-connection plugs 10Aq and 10Ar. Thus, the intermediate connection layers 20I and 20J are connected to each other. In other words, the first interconnect layer M1Q functions as the connection node X3 shown in FIG. 22.

Additionally, the first interconnect layer M1R is connected to each of the M1-connection plugs 10At and 10Au, and is also connected to the GND. Likewise, the first interconnect layer M1W is connected to each of the M1-connection plugs 10Az and 10Ba, and is also connected to the GND. The first interconnect layers M1T, M1U, M1V, and M1W are connected to M1-connection plugs 10Av, 10Aw, 10Ax, and 10Ay, respectively. Likewise, the first interconnect layers M1X, M1Y, M1Z, and M1Ba are connected to M1-connection plugs 10Bb, 10Bc, 10Bd, and 10Be, respectively. The first interconnect layers M1S and M1X are each connected to the VDD power supply. The first interconnect layer M1T is also connected to the bit line DTB in the upper layer. Likewise, the first interconnect layer M1U is connected to the bit line DBB in the upper layer. The first interconnect layer M1Y is connected to the bit line DBA in the upper layer. Furthermore, the first interconnect layer M1Z is connected to the bit line DTA in the upper layer. The first interconnect layer M1V is connected to the word line WLB in the upper layer. Likewise, the first interconnect layer M1Aa is connected to the word line WLA in the upper layer.

According to the tenth exemplary embodiment, the same effects as those of the first exemplary embodiment can be obtained by forming the intermediate connection layer 20. Further, the bent shape is formed by the intermediate connection layer having a thickness smaller than that of the first interconnect layer M1, thereby making it possible to increase the production margin for lithography or the like. Moreover, the intermediate connection layer 20 can be exclusively used for the local interconnect function, thereby increasing the degree of freedom of design.

The present invention is not limited to the first to tenth exemplary embodiments, and can be modified in various manners without departing from the scope of the present invention. The first to tenth exemplary embodiments can be combined as desirable. The present invention exhibits significant effects especially in SoC devices having a multilayer interconnection structure and including capacitor elements or the like (e.g., MIM capacitor and mixed DRAMs) which are mixed between the lower conductive layer 11 and the upper interconnect layer (first interconnect layer M1 or the like), for example. This is because a short-circuit is likely to occur due to an opening failure caused when the interlayer insulating film formed in a region other than the region in which functional elements are disposed is increased in thickness due to the planarization and when connection holes for connecting the lower conductive layer and the upper conductive layer are elongated, or due to a tapered shape. In addition, there are problems in that the parasitic capacitance between via holes which are close to each other is increased and the resistance of connection plugs is increased due to the increase in film thickness. However, these problems can be suppressed or resolved by applying exemplary embodiments of the present invention.

When the intermediate connection layer is used for intersecting lines of a flip-flop circuit within an SRAM memory cell, collateral portions of the nodes and the connection holes connected to the bit lines and word lines are omitted, which results in a reduction in the effect of the parasitic capacitance between the M1-connection plugs. Moreover, when a capacitor element is disposed in the upper layer space thus formed, it is possible to form an SRAM cell in which the capacitance between intersecting nodes is increased and the SER resistance is improved.

While, in the exemplary embodiments of the present invention, a description has been given of the example where the positions of the connection plugs formed on and below the intermediate connection layer 20 are intentionally shifted in the memory cell array region of the SRAM section 3B, the structure can be preferably applied to any regular layout region like the memory cell array region. The above-mentioned advantageous effects can be obtained by applying the structure to the regular layout region. While the description has been given of the example where a single intermediate connection layer is formed so as to intentionally shift the positions of the connection plugs formed on and below the intermediate connection layer, a plurality of intermediate connection layers may be formed depending on the purposes and needs. Further, the M1-connection plugs formed on the upper surface and the lower surface of the intermediate connection layer may have different sizes. Furthermore, the intermediate connection layer can be shared not only by the bit lines and local interconnections as described in the exemplary embodiments, but also by connection pads and interconnect layers of peripheral circuits. Alternatively, the intermediate connection layer can be shared by IP macros and functional elements (e.g., a ROM and a capacitor element). Although the first interconnect layers M1 are illustrated as an example of the upper-layer interconnection to be connected to the lower conductive layer, the second interconnect layers M2 or upper-layer interconnection may also be used. Moreover, any intermediate connection layer may be used as long as the connection plugs disposed on and below the intermediate connection layer can be electrically connected to each other, and the intermediate connection layer may not completely cover the connection plug disposed in the lower layer.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to tenth exemplary embodiments can be combined as desirable by one of ordinary skill in the art.

What is claimed is:

1. A semiconductor chip including memory cells, the semiconductor chip comprising:
    semiconductor substrate;
    a lower conductive layer including a gate electrode interconnect layer and a diffusion layer of the semiconductor substrate;
    an interlayer insulating film formed on the lower conductive layer;
    an upper interconnect layer formed on the interlayer insulating film; and
    connection plugs disposed to electrically connect the lower conductive layer and the upper interconnect layer,
    wherein one of the memory cells comprises;
    a first inverter including a first transistor having a first conductivity type;
    a second inverter including a second transistor having the first conductivity type, an output of the second inverter connecting to an input of the first inverter and an input of the second inverter connecting to an output of the first inverter;

a first electrical connection between one end of the first transistor made of the lower conductive layer and a first line made of the upper conductive layer, the first electrical connection connecting to the output of the first inverter; and a second electrical connection between one end of the second transistor made of the lower conductive layer and a second line made of the upper conductive layer, the second electrical connection connecting to the output of the second inverter, wherein the first electrical connection comprises:

a first connection plug extending from an immediately above position of the one end of the first transistor;

a second connection plug disposed at a shift position from the immediately above position of the one end of the first transistor to recede from the second electrical connection; and a first intermediate line made of an intermediate connection layer for electrically connecting the first and the second connection plugs.

2. The semiconductor chip according to claim 1, wherein the second electrical connection comprises:

a third connection plug extending from an immediately above position of the one end of the second transistor;

a fourth connection plug disposed at a shift position from the immediately above position of the one end of the second transistor to recede from the first electrical connection; and a second intermediate line made of the intermediate connection layer for electrically connecting the third and the fourth connection plugs.

3. The semiconductor chip according to claim 1, wherein the memory cells are SRAM memory cells.

4. The semiconductor chip according to claim 3, wherein a layout of the memory cells is a horizontal cell layout.

5. The semiconductor chip according to claim 1, further comprising a logic circuit section that uses data stored in the memory cells.

6. The semiconductor chip according to claim 1, wherein the intermediate connection layer has a thickness smaller than that of the upper interconnect layer.

7. The semiconductor chip according to claim 1, wherein the intermediate connection layer comprises a low-resistance conductive film.

8. The semiconductor chip according to claim 1, wherein the intermediate connection layer is used for connecting electrically-disconnected portions of the lower conductive layer.

9. The semiconductor chip according to claim 1, further comprising a DRAM section, wherein the intermediate connection layer and at least one of a bit line and a word line of the DRAM section are formed in a same layer.

10. The semiconductor chip according to claim 1, wherein the interlayer insulating film has a laminated structure made of a plurality of insulating films.

11. The semiconductor chip according to claim 2, wherein the second and fourth connection plugs are arranged on a line parallel to a side of a rectangular-shaped memory cell boundary.

12. A semiconductor device comprising:

a semiconductor chip; and memory cells mounted on the semiconductor chip, wherein the semiconductor chip comprises:

a semiconductor substrate;

a lower conductive layer including a gate electrode interconnect layer and a diffusion layer of the semiconductor substrate;

an interlayer insulating film formed on the lower conductive layer;

an upper interconnect layer formed on the interlayer insulating film; and connection plugs disposed to electrically connect the lower conductive layer and the upper interconnect layer, wherein one of the memory cells comprises:

a first inverter including a first transistor having a first conductivity type;

a second inverter including a second transistor having the first conductivity type, an output of the second inverter connecting to an input of the first inverter and an input of the second inverter connecting to an output of the first inverter;

a first electrical connection between one end of the first transistor made of the lower conductive layer and a first line made of the upper conductive layer, the first electrical connection connecting to the output of the first inverter; and a second electrical connection between one end of the second transistor made of the lower conductive layer and a second line made of the upper conductive layer, the second electrical connection connecting to the output of the second inverter, wherein the first electrical connection comprises:

a first connection plug extending from an immediately above position of the one end of the first transistor;

a second connection plug disposed at a shift position from the immediately above position of the one end of the first transistor to recede from the second electrical connection; and a first intermediate line made of an intermediate connection layer for electrically connecting the first and the second connection plugs.

* * * * *